(12) United States Patent
Ueno

(10) Patent No.: US 7,164,287 B2
(45) Date of Patent: Jan. 16, 2007

(54) SEMICONDUCTOR DEVICE

(75) Inventor: Hiroki Ueno, Kokubunji (JP)

(73) Assignee: Renesas Technology Corp., Tokyo (JP)

( * ) Notice: Subject to any disclaimer, the term of this patent is extended or adjusted under 35 U.S.C. 154(b) by 120 days.

(21) Appl. No.: 10/968,945

(22) Filed: Oct. 21, 2004

(65) Prior Publication Data

US 2005/0110516 A1    May 26, 2005

(30) Foreign Application Priority Data

Nov. 26, 2003   (JP) .............................. 2003-394990

(51) Int. Cl.
*H03K 17/16*    (2006.01)
*H03K 19/003*   (2006.01)
*H03K 19/0175*  (2006.01)
*H03K 19/094*   (2006.01)

(52) U.S. Cl. ........................... 326/30; 326/26; 326/27; 326/82; 326/83; 326/86; 326/87

(58) Field of Classification Search ............ 326/30–34, 326/82–87, 90, 91
See application file for complete search history.

(56) References Cited

U.S. PATENT DOCUMENTS 5,666,078 A * 9/1997 Lamphier et al. ........... 327/108
6,049,221 A * 4/2000 Ishibashi et al. .............. 326/30
6,087,847 A * 7/2000 Mooney et al. ............... 326/30
6,115,298 A * 9/2000 Kwon et al. ................. 365/198
6,384,621 B1 * 5/2002 Gibbs et al. .................. 326/30
6,573,747 B1 * 6/2003 Radhakrishnan ............. 326/30
2005/0174143 A1* 8/2005 Nguyen et al. ............... 326/30

FOREIGN PATENT DOCUMENTS

JP    2003-198357    12/2001

\* cited by examiner

*Primary Examiner*—Rexford Barnie
*Assistant Examiner*—Dylan White
(74) *Attorney, Agent, or Firm*—Reed Smith LLP; Stanley P. Fisher, Esq.; Juan Carlos A. Marquez, Esq.

(57) ABSTRACT

The present invention provides a semiconductor device that can shorten the initialization cycle of impedance matching of interface buffers and reduce as much as possible affects on other circuits at the time of fine control thereafter. The semiconductor device (1) includes interface buffers (18a to 18c) whose internal impedances are controlled by impedance control data and an impedance control circuit (35) that generates the impedance control data. The impedance control circuit includes a first impedance control mode that initially generates the impedance control data by a binary search and comparison operation resulting from predetermined impedance control steps and sets the impedance control data in the interface buffers, and a second impedance control mode that updates the impedance control data set in the interface buffers by a sequential comparison operation resulting from the predetermined impedance control steps.

1 Claim, 23 Drawing Sheets

SEMICONDUCTOR DEVICE

INCORPORATION BY REFERENCE

The present application claims priority from Japanese application JP2003-394990 filed on Nov. 23, 2003, the content of which is hereby incorporated by reference into this application.

BACKGROUND OF THE INVENTION

1. Field of the Invention

The present invention relates to technology that controls the internal impedances of interface buffers in a semiconductor device and to programmable impedance technology, and in particular to technology effectively applied to programmable impedance technology that adapts data output buffers in a semiconductor device such as a SRAM (Static Random Access Memory) to the impedances of transmission lines.

2. Description of the Related Art

When the transmission and reception of data between a semiconductor device and the outside are conducted at a high speed, there are instances where reflectance of the data signals occurs due to the resistance of wiring connected to the outside and a certain constant impedance resulting from inductance and parasitic capacitance, so that normal transmission and reception of the data cannot be conducted. In order to eliminate this data reflectance, the impedances in the semiconductor device and the outside may be matched. However, in principle, semiconductor devices have the characteristic that the internal impedances change easily due to external factors such as the operating voltage and temperature. Thus, dynamic control is conducted so that, after the impedances of output buffers are initially matched to an external impedance for reference (ordinarily, a resistance value that a user has set), the impedances inside the semiconductor device are automatically matched to the outside impedance regardless of the operating voltage and temperature changes.

JP-A-2003-198357 discloses technology that enables dynamic control of the internal impedances even when a read operation continues, so that the precision of the matching of the impedances resulting from a programmable impedance circuit is improved. In other words, in push-pull format output buffers, impedance control data of output transistors placed in an OFF state at the time of an output operation are updated, whereby the output operation is not affected even if the impedances are updated during the output operation.

The present inventor investigated a comparison operation for matching the internal impedances with the programmable impedance circuit. According to this investigation, in the push-pull format output buffers, when attempting to control the output impedances by selecting a number of transistors used in the output operation from numerous output transistors connected in parallel to an output terminal, the transistors used in the output operation are selected by the values of plural bit impedance codes. In order to determine the plural bit impedance codes, a case where the comparison is conducted with a method such as a binary search and comparison operation, where a comparison with the external impedance is conducted from large impedance steps that have been weighted, and a case where the comparison is conducted with a method such as a sequential comparison operation, where a comparison with the external impedance is conducted with impedance steps that have not been weighted, are conceivable.

However, among internal impedance matching operations, there are an initial matching resulting from turning the power ON and an updating operation in an active state thereafter. When both are conducted with the binary search and comparison operation, the initial matching can be conducted quickly, but in the updating operation, there are instances where, even if one impedance control step is changed, that becomes a step with a large impedance. Thus, there is the potential for a large current to flow in the programmable impedance circuit and for the large current to become power supply noise, causing the performance of other circuits to deteriorate. With respect thereto, in the sequential comparison operation, even if one impedance control step is changed, this corresponds only to an LSB 1 bit portion of the impedance codes (it only becomes a small impedance control step that is not weighted), and a large change in the impedance does not occur. However, an enormous amount of time is required for the initial matching. When impedance control is conducted with steps weighted by the power of 2, comparison operations of a maximum of n times may be conducted in the binary search and comparison operation, but when this is conducted with the sequential comparison operation, comparison operations of n-to-the-power-of-2 times must be conducted.

SUMMARY OF THE INVENTION

It is an object of the present invention to provide a semiconductor device configured so that the initialization cycle of impedance matching of interface buffers is shortened and which can reduce as much as possible affects on other circuits at the time of dynamic matching resulting from changes in the impedances after the initialization.

It is another object of the invention to provide a semiconductor device configured so that an output buffer impedance matching operation does not affect the output operations of the output buffers.

These and other objects and novel features of the invention will be apparent from the description of the specification and the attached drawings.

(1) A semiconductor device pertaining to the invention includes: interface buffers whose internal impedances are controlled by impedance control data; and an impedance control circuit that generates the impedance control data, wherein the impedance control circuit includes a first impedance control mode that generates the impedance control data by a binary search and comparison operation resulting from predetermined impedance control steps and sets the impedance control data in the interface buffers, and a second impedance control mode that updates the impedance control data set in the interface buffers by a sequential comparison operation resulting from the predetermined impedance control steps.

Because the impedances of the interface buffers are initially matched by the binary search and comparison operation, the initialization cycle of the impedance matching can be shortened in comparison to a case where it is conducted by the sequential comparison operation. Because the sequential comparison operation is conducted in the matching with respect to the impedances after the initialization, affects on other circuits resulting from power supply noise can be reduced as much as possible in comparison to a case where it is conducted by the binary search and comparison operation.

As a specific embodiment of the invention, in the first impedance control mode, the impedance control steps used in the binary search and comparison operation are weighted by the power of 2. In the second impedance control mode, the impedance control steps used in the sequential comparison operation are not weighted.

(2) A semiconductor device according to the aspect of the impedance control steps includes: interface buffers whose internal impedances are controlled by impedance control data; and an impedance control circuit that generates the impedance control data, wherein the impedance control circuit includes a first impedance control mode that generates the impedance control data by a sequential comparison operation resulting from predetermined impedance control steps and sets the impedance control data in the interface buffer, and a second impedance control mode that updates the impedance control data set in the interface buffer by a sequential comparison operation resulting from the predetermined impedance control steps, and the impedance control steps of the first impedance control mode and the impedance control steps of the second impedance control mode are different.

By using relatively large impedance control steps at the time the impedances of the interface buffers are initially matched and using relatively small impedance control steps in the matching with respect to changes in the impedances after the initialization, both a shortening of the initialization cycle with respect to the impedance matching and a reduction of affects on other circuits resulting from fine control of the impedances after the initialization can be satisfied.

In a preferred embodiment of the invention, the impedance control steps of the second impedance control mode are smaller steps than the impedance control steps of the first impedance control mode.

As a specific embodiment of the invention, the impedance control steps of the first impedance control mode are different steps of plural stages. Relatively larger steps of the different steps of plural stages are used in the former sequential comparison operation and relatively smaller steps are used in the latter sequential comparison operation.

(3) As a specific embodiment of the invention according to the above two aspects, the interface buffers are output buffers whose output terminals are from pad electrodes of a semiconductor chip to external connection terminals of a package.

Similarly, the interface buffers are input buffers whose input terminals are from pad electrodes of a semiconductor chip to external connection terminals of a package.

Similarly, the interface buffers are output buffers or input buffers that are connected to pad electrodes of a semiconductor chip and are not connected to external connection terminals of a package. The output buffers and input buffers are dummy output buffers and input buffers that connect dummy wiring inside the package simulating delay components such as resistance, capacitance and inductance parasitic on the package wiring.

As a specific embodiment of the invention according to the above two aspects, the interface buffers include push-pull circuits whose mutual conductance is variably controlled in accordance with the set impedance control data.

As a specific embodiment of the invention according to the above two aspects, the first impedance control mode is started by the application of a power supply voltage and is ended by the elapse of a predetermined time. In this case, after the first impedance control mode ends, the second impedance control mode generates impedance control data to be updated per predetermined plural cycles of a synchronization clock and sets the generated impedance control data in the interface buffers.

(4) A semiconductor device according to another aspect of the invention includes: output buffers whose output operations are in synchronization with a first clock and whose internal impedances are controlled by impedance control data; and an impedance control circuit that generates the impedance control data in synchronization with a second clock, wherein the output buffers include push-pull circuits whose mutual conductance at the time of the output operations is variably controlled by the set impedance control data, and the impedance control circuit uses, as a mutual conductance control target, output transistors in an OFF state in the push-pull circuits and causes a set timing of the impedance control data with respect to a control target to be synchronized with the first clock.

Because the impedance control circuit uses, as a mutual conductance control target, the output transistors in the OFF state in the push-pull circuits, changes in the impedances do not affect the output operations even if the impedances of the output buffers are changed during the output operations. Moreover, because the set timing of the impedance control data with respect to the control target is synchronized with the first clock, when the impedance control data are being updated using the output transistors in the OFF state as targets, preventing a situation where the outputs become inverted in the middle of the updating and the output transistors in the OFF state are switched becomes substantially possible.

As a specific embodiment of the invention, the push-pull circuits comprise plural first output transistors that are connected in parallel to an output terminal and output a high level in an ON state, and plural second output transistors that are connected in parallel to the output terminal and output a low level in an OFF state, with numbers of the first output transistors and the second output transistors placed in the ON state at the time of the output operations being respectively controlled in accordance with the impedance control data.

In this case, after the impedance control circuit initially sets the impedance control data of the output buffers, the impedance control circuit generates impedance control data to be updated per predetermined plural cycles of the second clock, and sets the generated impedance control data in the output buffers in synchronization with the first clock. As a preferred embodiment, the timing at which the generated impedance control data are set in the output buffers in synchronization with the first clock is within an output operation cycle period that the first clock defines.

As another specific embodiment, the impedance control circuit includes a resistance voltage dividing circuit that is connected to an external resistor element and in which predetermined voltage dividing nodes are formed, with the impedance control circuit generating the impedance control data on the basis of divided voltage levels of the predetermined voltage dividing nodes.

Simply described, the effects obtained by representative embodiments of the inventions disclosed in the present application are as follows.

Namely, the initialization cycle of impedance matching of the interface buffers can be shortened, and affects on other circuits at the time of dynamic matching with respect to changes in the impedances after the initialization can be reduced as much as possible.

The invention can be configured so that the output buffer impedance matching operation does not affect the output operations of the output buffers.

DETAILED DESCRIPTION OF THE INVENTION

Figure 1:
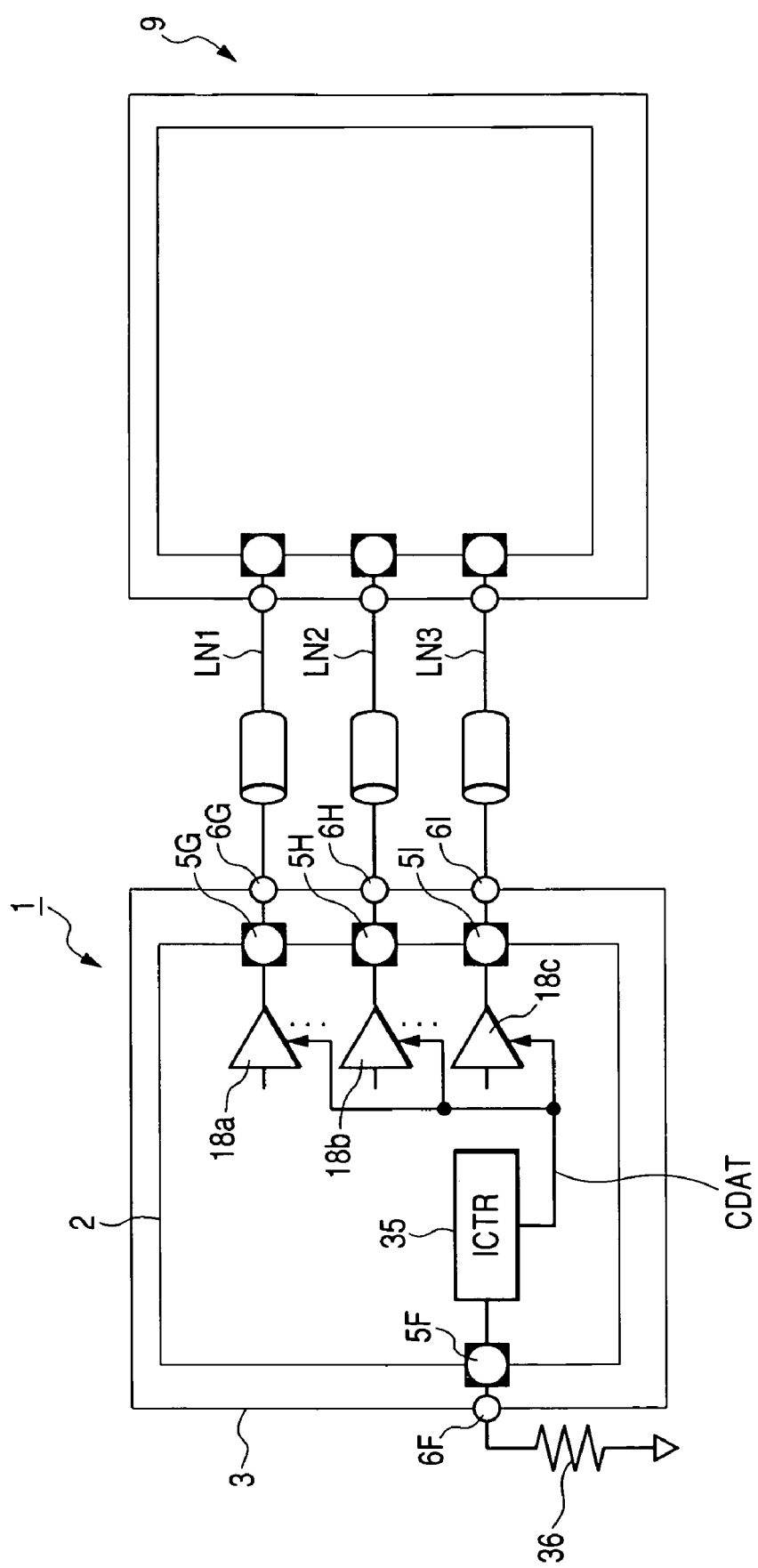
FIG. 1 is a block diagram showing a SRAM, which is an example of a semiconductor device pertaining to the invention, centering on the configuration of impedance matching.

FIG. 1 shows a SRAM 1, which is an example of a semiconductor device pertaining to the invention, centering on the configuration of impedance matching.

Although it is not particularly limited, the SRAM 1 comprises a SRAM chip 2 serving as a semiconductor chip (pellet) and a packaging circuit portion (also called a "package" below) 3 connected to the SRAM chip 2. The SRAM chip 2 is formed on one semiconductor substrate such as single crystal silicon by, for example, a CMOS integrated circuit fabrication technique. Although it is not particularly limited, the package 3 includes a configuration for face-down packaging, and is configured by a flip chip relocation wiring layer and a multilayer wiring substrate on which the flip chip is mounted. The SRAM chip 2 includes plural pad electrodes 5F and 5G to 5I representatively shown as external terminals. The package 3 includes external connection terminals (packaging terminals) 6F and 6G to 6I representatively shown as plural packaging terminals for packaging the SRAM 1 on a packaging substrate (not shown). The pad electrodes 5G to 5I are connected to the external connection terminals 6G to 6I via wiring of the package 3. The external connection terminals 6G to 6I serve as data output terminals. The external connection terminals 6G to 6I are connected to data input terminals of a microprocessor 9 via representatively shown data signal lines LN1 to LN3.

Three data output buffers 18a to 18c are representatively shown as external output buffers on the SRAM chip 2. Output terminals of the data output buffers 18a to 18c are connected to the pad electrodes 5G to 5I. The internal impedances of the data output buffers 18a to 18c are controllable in accordance with impedance control data CDAT. By "internal impedances" is meant impedances seen from the output side, i.e., output impedances. An impedance control circuit (ICTR) 35 generates the impedance control data CDAT. The impedance control data CDAT are determined on the basis of the resistance value of an external resistor element 36 connected to the external connection terminal 6F. For example, when the transmission line impedances or characteristic impedances of the data signal lines LN1 to LN3 are RQ/N, the resistance value of the external resistor element 36 is set to RQ, whereby the internal impedances of the data output buffers 18a to 18c become RQ/N.

Figure 2:
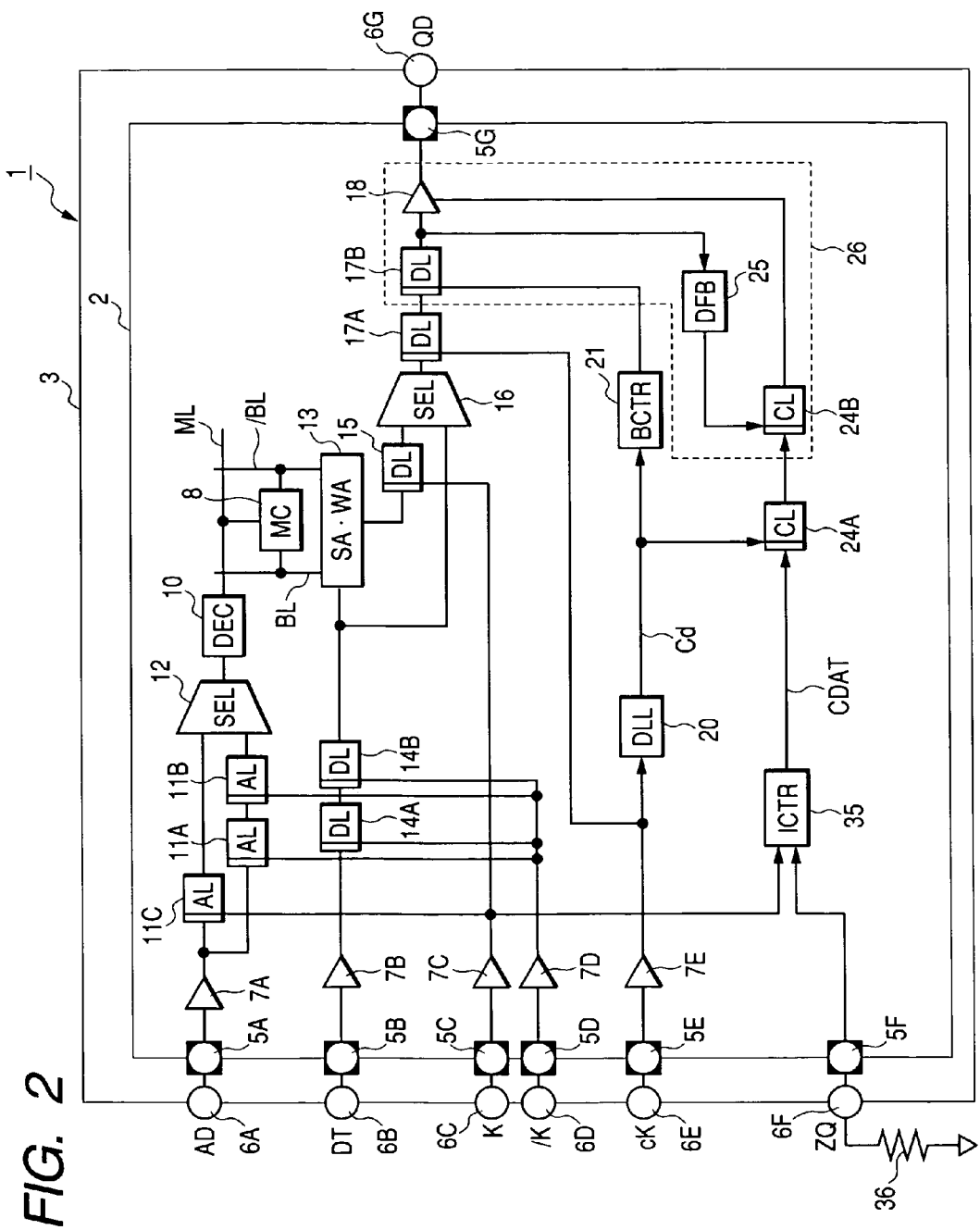
FIG. 2 is a block diagram showing in detail the entire SRAM of FIG. 1.

FIG. 2 shows the entire SRAM 1 in detail. The SRAM chip 2 includes plural pad electrodes 5A to 5G representatively shown as external terminals. The package 3 includes external connection terminals (packaging terminals) 6A to 6G serving as plural packaging terminals for packaging the SRAM 1 on the packaging substrate (not shown). The pad electrodes 5A to 5G are connected to the external connection terminals 6A to 6G via wiring of the package 3. With respect to the letters shown next to the external connection terminals 6A to 6G, "AD" means input address signal, "DT" means write data, "K" and "/K" mean clocks for internal operations, "C" means a clock for data input, "ZQ" means an external resistor connection terminal, and "QD" means read data. The symbol "/" means that a signal to which that symbol has been attached is an inversion signal.

One static memory cell (MC) 8 is representatively shown on the SRAM chip 2. A selection terminal of the memory cell 8 is connected to a word line WL, and data input/output terminals of the memory cell 8 are connected to complementary bit lines BL and /BL. In actuality, numerous memory cells are arranged in a matrix to configure a memory cell array. The word line WL is selected by an address decoder (DEC) 10. The address signal AD is inputted to a buffer 7A from the terminal 6A, latched in address latches (AL) 11A, 11B and 11C in synchronization with the clocks K and /K, selected by a selector (SEL) 12, and inputted to the address decoder 10 and decoded. The address latch 11C includes a preset address counter function used in burst access. An amp circuit 13, which includes a sense amp (SA) and a write amp (WA), is connected to the complementary bit lines BL and /BL. The write data DT are inputted to a buffer 7B from the terminal 6B, latched in data latches (DL) 14A and 14B in synchronization with the clocks K and /K, and inputted to the amp circuit 13, and the write amp thereof drives the complementary bit lines BL and /BL in accordance with the write data. The data read to the complementary bit lines BL and /BL from the memory cell 8 are amplified by the sense amp of the amp circuit 13, selected by a selector 16 via a data latch 15, and outputted from the terminal 6G via data latches (DL) 17A and 17B and a data output buffer 18. The "data output buffer 18" collectively refers to data output buffers such as the data output buffers 18a to 18c. When there is a read access instruction with respect to data written immediately before, the output of the data latch 14B is selected by the selector 16 and outputted to the outside. 7C to 7E are clock buffers. A delay loop lock (DLL) circuit 20 generates a clock (also called a delay clock) Cd where the clock C is delayed predetermined plural cycles in order to synchronize the timing of the data output from the terminal 6G with the clock C. The delay clock controls the latch timing of the data latch 17B via a burst controller (BCTR) 21 and determines the data output timing. The impedance control circuit (ICTR) 35 generates impedance control data (impedance codes) that control the impedance of the output buffer 18 in accordance with the resistance value of the external resistor element 36 connected to the terminal 6F. The impedance control data are supplied to the plural bit output buffer 18 via data latches 24A and 24B, and the output impedance thereof is controlled. The control of the output impedance is conducted as control of the ON resistance of a push-pull output circuit. A data feedback circuit (DFB) 25 is configured to reference the output level of the data latch 17B and conduct setting of the ON resistance of output transistors of a reverse polarity from that of the output operation. Because the setting of the ON resistance of the output transistors of the same polarity as that of the output operation is not conducted in parallel with the output operation, the potential for the output level to fluctuate undesirably while changing the setting of the ON resistance can be prevented in advance. The control of the output impedance with respect to the output buffer 18 circuit is for conducting impedance matching with the characteristic impedance of the data transmission path to which the terminal 6G is connected. In FIG. 2, 26 configures a data output circuit.

Figure 3:
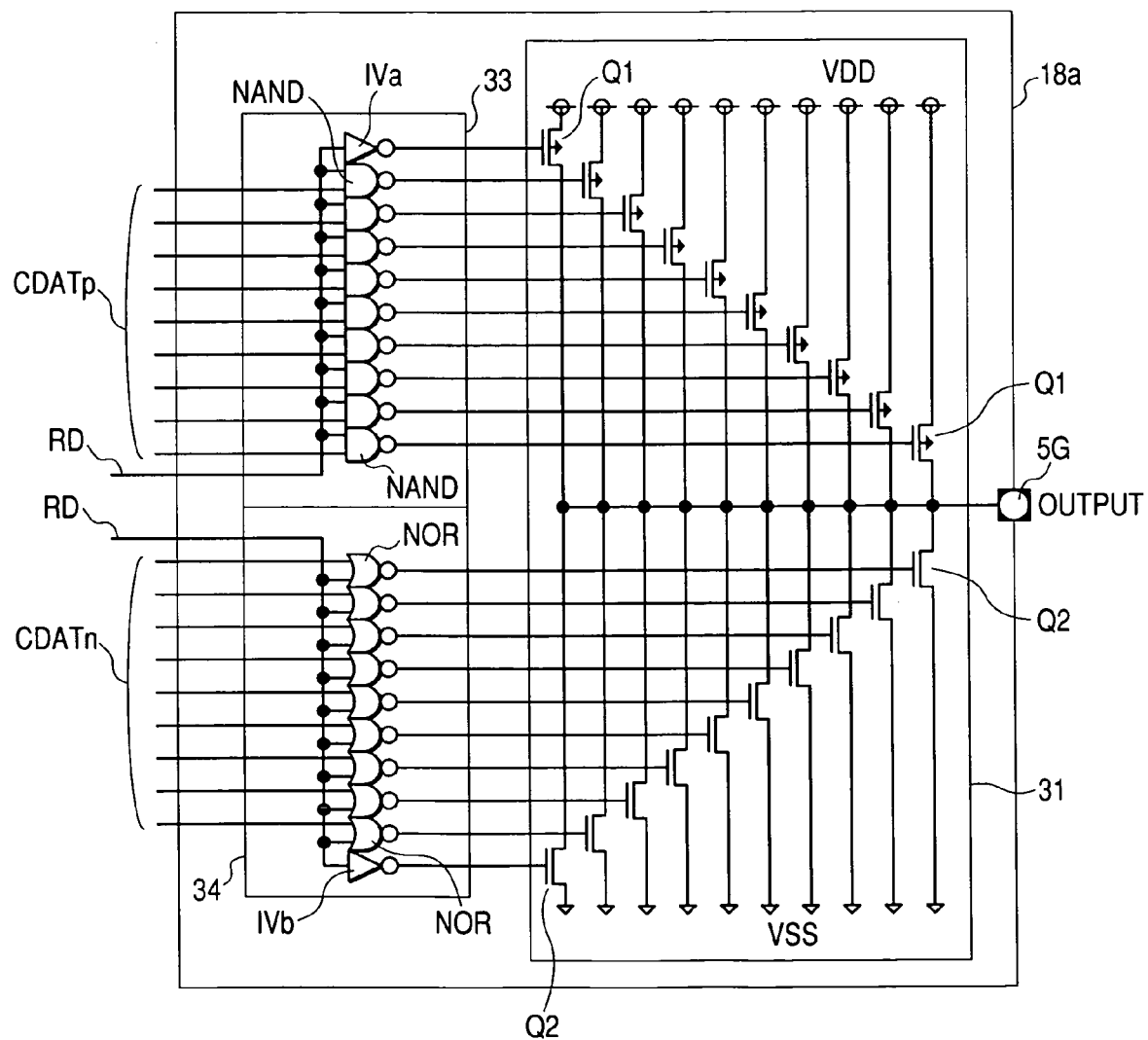
FIG. 3 is a circuit diagram showing an example of a data output buffer.

FIG. 3 shows an example of the data output buffer 18a. The data output buffer 18a includes prebuffers 33 and 34 and an output portion 31. The output portion 31 serves as a push-pull circuit in which the mutual conductance at the time of the output operation is controlled in accordance with the impedance control data CDAT (CDATp, CDATn), and comprises, for example, plural p-channel MOS transistors (first output MOS transistors) Q1, which are connected in parallel to the output terminal 5G and output high levels in an ON state, and plural n-channel MOS transistors (second output MOS transistors) Q2 that are connected in parallel to the output terminal 5G and output low levels in an ON state. Below, the p-channel MOS transistors will also be referred to as PMOS transistors and the n-channel MOS transistors will also be referred to as NMOS transistors.

The impedance control data CDAT comprise CDATp and CDATn. The impedance control data CDATp for the p-channel MOS transistors are for the first output MOS transistors Q1, and the impedance control data CDATn for the n-channel MOS transistors are for the second output MOS transistors Q2. The impedance control data CDATp are supplied to the prebuffer 33, and the impedance control data CDATn are supplied to the prebuffer 34. The prebuffer 33 includes one inverter IVa and NAND gates NAND of a number corresponding to the bit number of the impedance control data CDATp. Corresponding bits of the impedance control data CDATp are individually supplied to input terminals of the NAND gates NAND, and read data RD are mutually supplied to other input terminals of the NAND gates NAND. The prebuffer 34 includes one inverter IVb and NOR gates NOR of a number corresponding to the bit number of the impedance control data CDATn. Corresponding bits of the impedance control data CDATn are individually supplied to input terminals of the NOR gates NOR, and read data RD are mutually supplied to other input terminals of the NOR gates NOR. Thus, in a high level output operation resulting from RD="1", the number of the first output MOS transistors Q1 that receive the output of the NAND gates NAND and are placed in an ON state is a number corresponding to the bit number of a logical value "1" of the impedance control data CDATp. Also, in a low level output operation resulting from RD="0", the number of the second output MOS transistors Q2 that receive the output of the NOR gates NOR and are placed in an ON state is a number corresponding to the bit number of a logical value "0" of the impedance control data CDATn. The ON resistance of the output portion 31 is determined in accordance with the number of MOS transistors placed in the ON state at the time of the output operation. The impedance control circuit will be described below.

Figure 4:
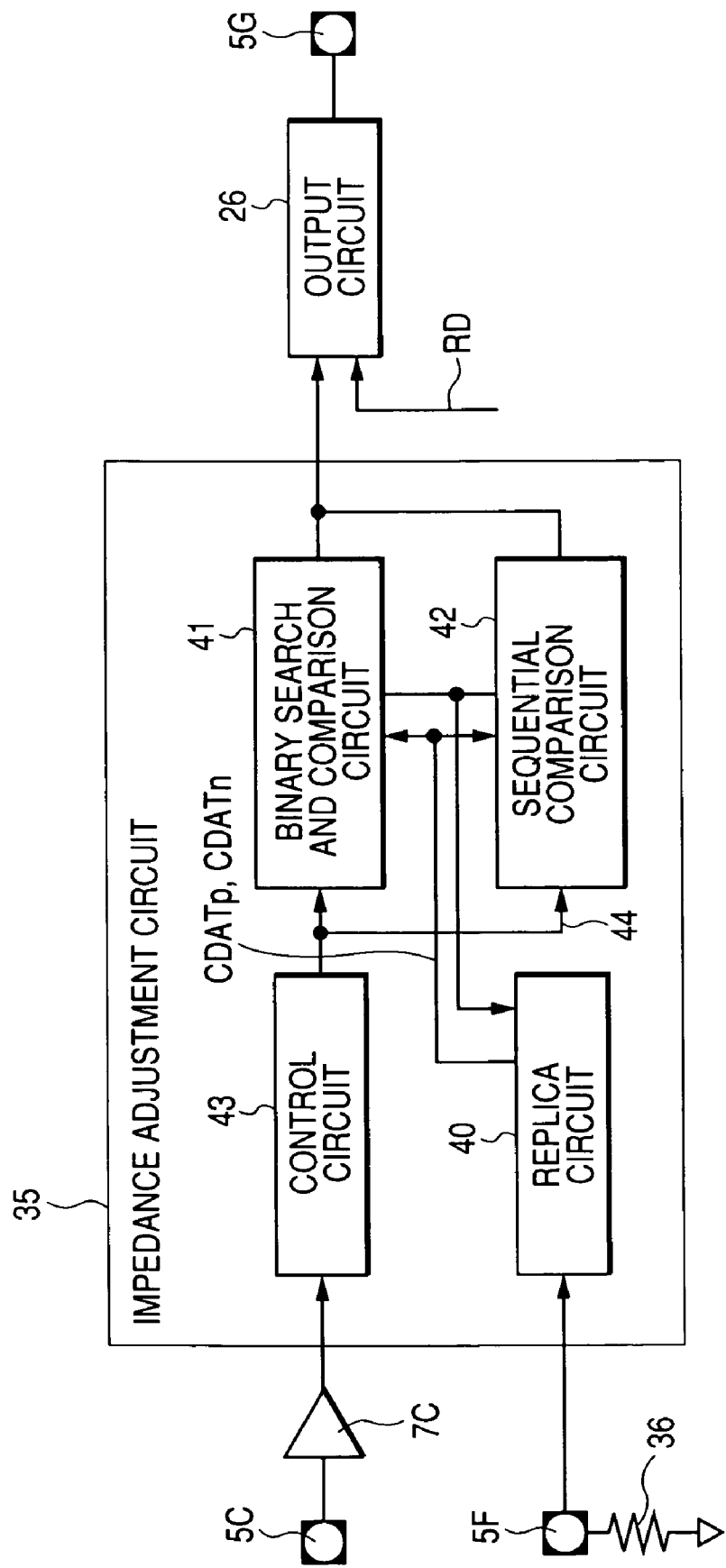
FIG. 4 is a block diagram showing an example of an impedance control circuit.

FIG. 4 is a block diagram showing the impedance control circuit 35. The impedance control circuit 35 includes a replica circuit 40, a binary search and comparison circuit 41, a sequential comparison circuit 42 and a control circuit 43. The replica circuit 40 configures a resistance voltage dividing circuit together with the external resistor element 36 and generates the impedance control data CDATp and CDATn by control of the binary search and comparison circuit 41 or the sequential comparison circuit 42. With respect to which of the binary search and comparison circuit 41 and the sequential comparison circuit 42 to use, this is instructed by the control circuit 43 with a switching signal 44. The control circuit 43 instructs the operation of the binary search and comparison circuit 41 immediately after the power is turned ON, initially generates the impedance control data CDATp and CDATn with a binary search and comparison operation, and sets the generated impedance control data CDATp and CDATn in the output circuit 26. Thereafter, the control circuit 43 instructs the operation of the sequential comparison circuit 42 and updates the impedance control data CDATp and CDATn set in the output circuit 26 with a sequential comparison operation. The update operation is conducted every plural cycles of the clock signals K supplied from the terminal 5C.

Figure 5:
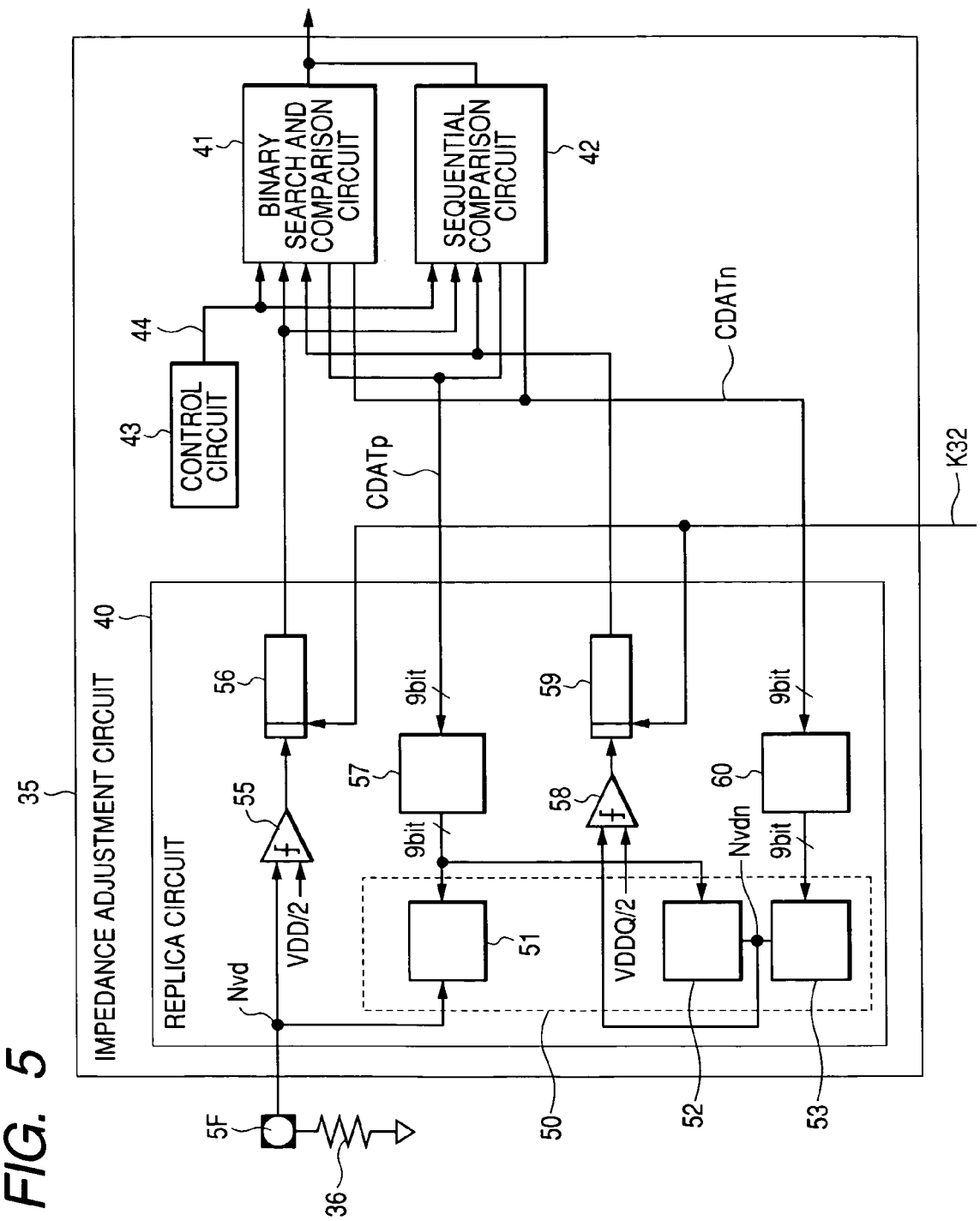
FIG. 5 is a block diagram showing an example of a replica circuit.
Figure 6:
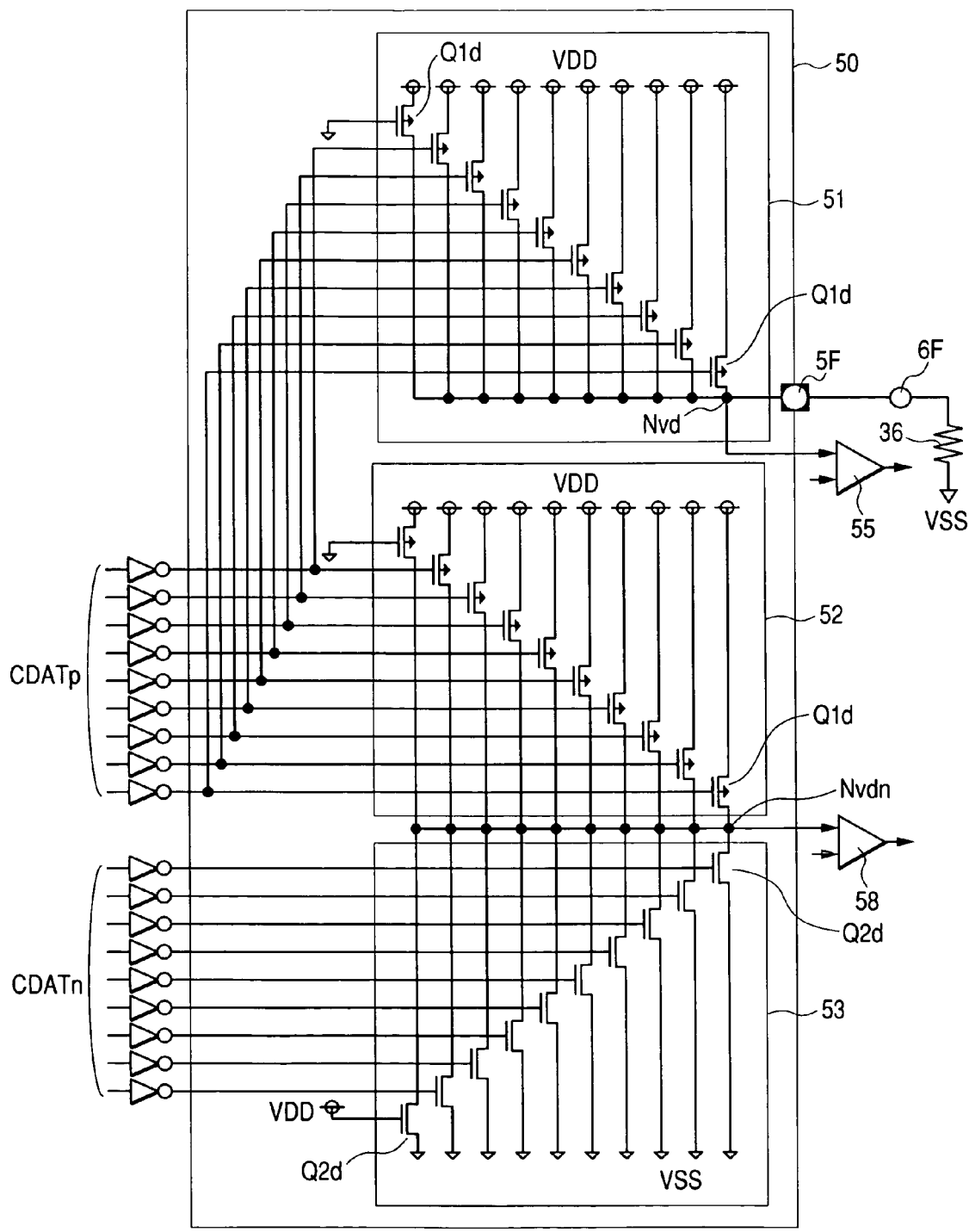
FIG. 6 is a circuit diagram showing a specific example of a replica MOS circuit.

FIG. 5 shows an example of the replica circuit 40. The replica circuit 40 includes, as a replica MOS circuit 50, two replica PMOS circuits 51 and 52 and one replica NMOS circuit 53. A specific example of the replica MOS circuit 50 is shown in FIG. 6. The replica PMOS circuits 51 and 52 serve as circuits where the circuit of the plural p-channel MOS transistors Q1 in the output portion 31 of FIG. 3 is simulated by plural p-channel MOS transistors Q1d. The size ratio of the MOS transistors Q1d with respect to the MOS transistors Q1 is a predetermined constant. Similarly, the replica NMOS circuit 53 is a circuit where the circuit of the plural n-channel MOS transistors Q2 in the output portion 31 of FIG. 3 is simulated by plural n-channel MOS transistors Q2d. The size ratio of the MOS transistors Q2d with respect to the MOS transistors Q2 is also a predetermined constant.

As is apparent from FIG. 6, the path leading to the ground voltage of VSS of the circuit from the power supply voltage VDD via the replica PMOS circuit 51, the terminals 5F and 6F and the external resistor element 36 is regarded as a resistance voltage dividing circuit including a predetermined voltage dividing node Nvd. As shown in FIG. 5, a voltage comparator 55 connected to the voltage dividing node Nvd compares the level of the voltage dividing node Nvd with a reference potential VDD/2. The comparison result is stored in a register 56. When the binary search and comparison circuit 41 or the sequential comparison circuit 42 outputs the impedance control data CDATp to be generated in accordance with the generation sequence of the impedance control data, the ON resistance of the replica PMOS circuit 51 is determined thereby, whereby the level of the voltage dividing node Nvd is determined. From the comparison result, if the level of the voltage dividing node is higher than VDD/2, the generation target bit of the impedance control data is set to the logical value "0", and if the level of the voltage dividing node is lower than VDD/2, the generation target bit of the impedance control data is set to the logical value "1". The impedance control data CDATp are generated by repeating the above operation several times while changing the generation target bit of the impedance control data. The determination results are converged to VDD/2 in accordance with all bits of the impedance control data CDATp being generated. The binary search and comparison operation by the binary search and comparison circuit 41 is used in the initial generation of the impedance control data CDATp. In this case, control steps in the impedance are weighted by the power of 2. First, the target bit of the impedance control data CDATp is determined by the control step of the largest weight, then the target bit of the impedance control data CDATp is determined by the control step of half that weight, and then the target bit of the impedance control data CDATp is determined by the control step of ¼ that weight. With this sequence, the values to the lowest bit of the impedance control data CDATp are sequentially determined. In the comparison operation by the sequential comparison circuit 42, the updating set from the lowest bit of the impedance control data CDATp on the basis of the result of comparison of the voltage of the voltage dividing node Nvd when the ON resistance of the replica PMOS circuit 51 is set using the impedance control data CDATp already generated is begun, and updating of the impedance control data CDATp is conducted so that the level of the voltage dividing node is converged to VDD/2. A voltage conversion circuit 57 is disposed in order to convert the voltage level of the impedance control data CDATp to the outside voltage level and apply it to the replica PMOS circuit 51 in view of the fact that the binary search and comparison circuit 41 and the sequential comparison circuit 42 operate at the internal operating voltage.

In the generation of the impedance control data CDATn, the level of a voltage dividing node Nvdn resulting from the replica PMOS circuit 52 and the replica NMOS circuit 53 is compared with the reference voltage VDD/2 by the voltage comparator 58. The comparison result is stored in a register 59. In a case where the impedance control data CDATn for NMOS are generated, conversely from the base of PMOS, from the comparison result, if the level of the voltage dividing node is higher than VDD/2, the generation target bit of the impedance control data is set to the logical value "1", and if the level of the voltage dividing node is lower than VDD/2, the generation target bit of the impedance control data is set to the logical value "0". The generation sequence of the impedance control data CDATn by the binary search and comparison circuit 41 or the sequential comparison circuit 42 is the same as the generation sequence of the impedance control data CDATp. However, because the ON resistance of the replica PMOS circuit 52 is determined by the impedance control data CDATp, it is preferable to generate the impedance control data CDATn after the impedance control data CDATp have been initially determined. 60 is a voltage conversion circuit corresponding to the impedance control data CDATn.

The operation cycle, where the resistance value of the replica PMOS circuit 51 is determined by the impedance control data CDATp, the comparison operation by the voltage comparison circuit 55 is conducted with respect to the divided voltages and the comparison result is latched in the register 56, is synchronized with the cycle of a 32 division clock K32 where the clock K is divided into 32 serving as the internal operation clock. In other words, the comparison operation cycle is conducted every 32 cycles of the clock K (i.e., 32 division clock K32).

Figure 7:
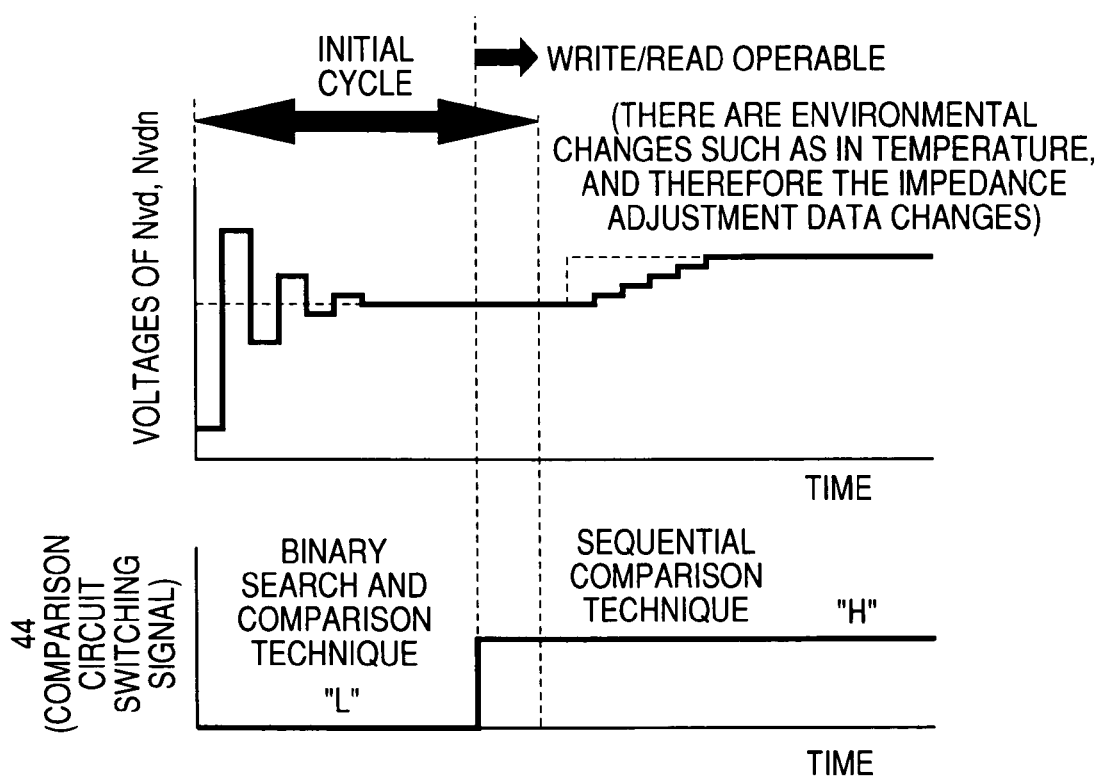
FIG. 7 is a timing chart showing control operation timing waveforms of impedance control data.
Figure 8A:
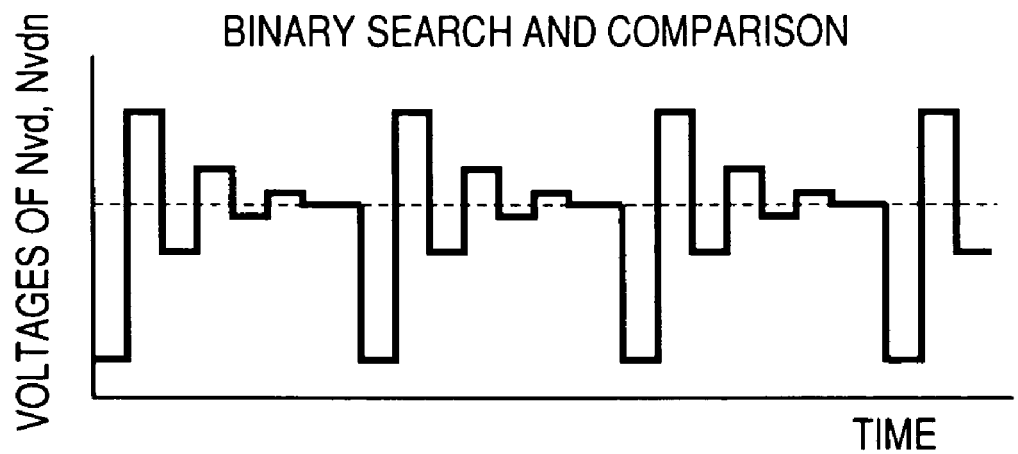
FIG. 8A is a timing chart showing, as a comparative example, a case where updating of the impedance control data is conducted by a binary search and comparison operation similar to initial setting.
Figure 8B:
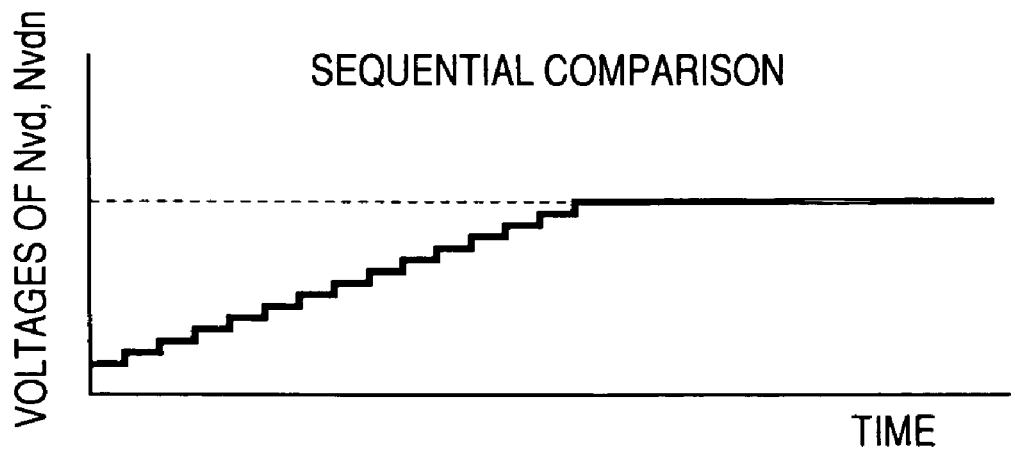
FIG. 8B is a timing chart showing, as a comparative example, a case where updating of the impedance control data and initial setting are both conducted by a sequential comparison operation.

FIG. 7 shows the control operation timing waveform of the impedance control data CDAT. Immediately after the power is turned ON, the binary search and comparison operation by the binary search and comparison circuit 41 is selected by the switching signal 44, and the impedance data CDATp and CDATn are initially generated. Thereafter, the sequential comparison operation by the sequential comparison circuit 42 is selected by the switching signal 44, and when the levels of the voltage dividing nodes Nvd and Nvdn fluctuate due to changes in temperature or the like, the impedance control data CDATp and CDATn are updated in accordance therewith. Because the updating of the impedance control data is conducted by the sequential comparison operation, fluctuations in the levels of the voltage dividing nodes Nvd and Nvdn resulting from that operation are kept small in comparison to the binary search and comparison operation. In a case where the updating of the impedance control data is also to be conducted by the binary search and comparison operation similar to the initial setting, there are cases where, as shown in the comparative example of FIG. 8A, relatively large level fluctuations arise in the voltage dividing nodes Nvd and Nvdn similar to the case of the initial setting. As shown in the comparative example of FIG. 8B, in a case where both the updating and the initial setting of the impedance control data are to be conducted by the sequential comparison operation, a long time is required for the initial generation. For example, assuming that the bit number of the impedance control data CDATp is 9 bits and the sizes of the nine MOS transistors Qd1 controlled by the impedance control data CDATp are equal, comparison determination operations of 9-to-the-power-of-2 times must be repeated in order to initially generate the impedance control data CDATp by the sequential comparison operation. In the case of the binary search and comparison operation, the comparison determination operation only has to be repeated 9 times.

Figure 9:
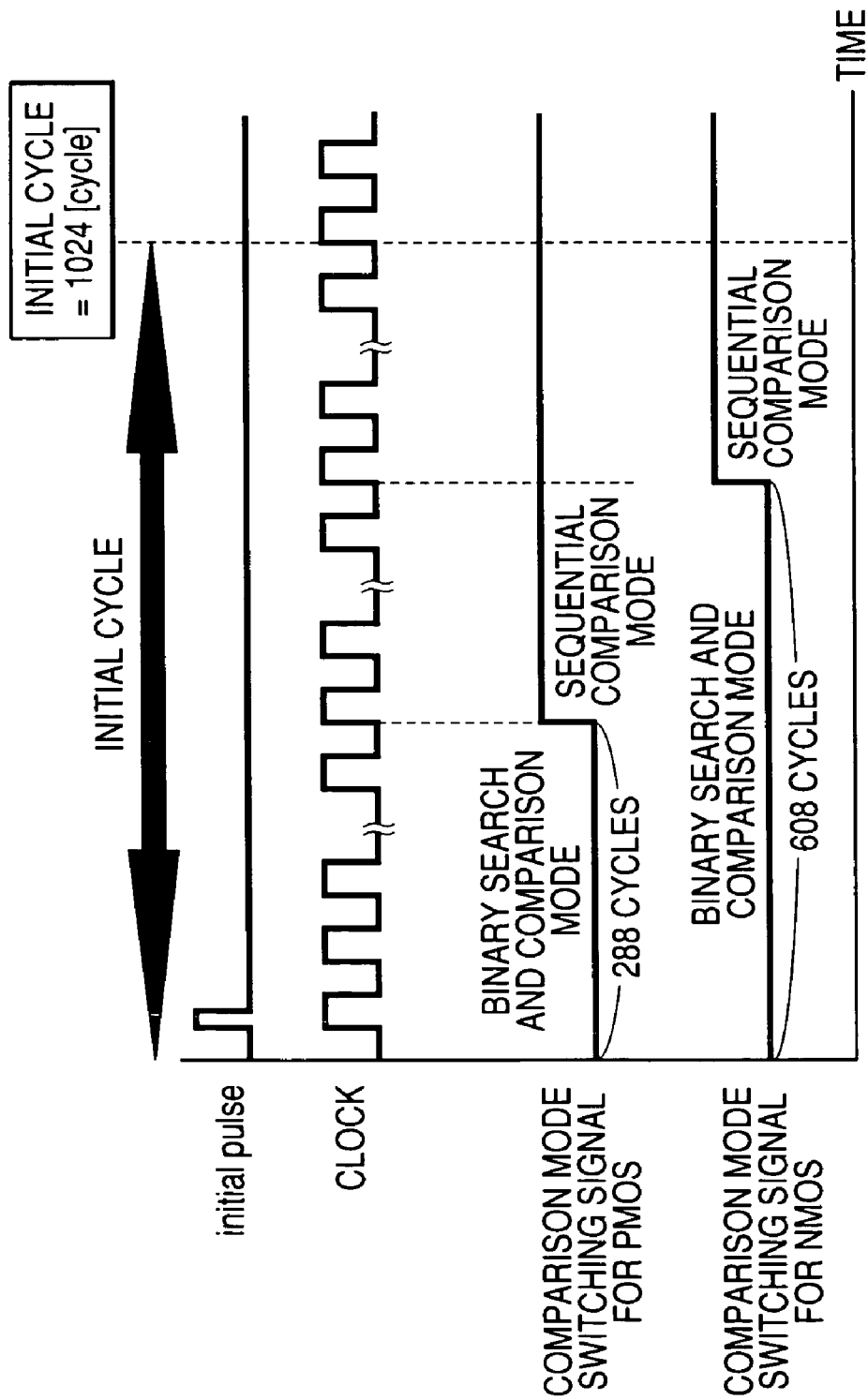
FIG. 9 is a timing chart showing the details of a start sequence.

FIG. 9 shows the details of a start sequence. Here, it will be assumed that the impedance control data of the PMOS side are 9 bits and that the comparison operation cycle by the binary search and comparison of all bits necessary therefor is 288 cycles of the clock K. The comparison mode switching signal of the PMOS side instructs at least a 288 cycle binary search and comparison mode, and thereafter instructs the sequential comparison mode. It will be assumed that the impedance control data of the NMOS side are 19 bits and that the comparison operation cycle by the binary search and comparison of all bits necessary therefor is 608 cycles of the clock K. The comparison mode switching signal of the NMOS side instructs at least a 608 cycle binary search and comparison mode, and thereafter instructs the sequential comparison mode. The initial cycle maintains at least 608 cycles of the clock K. In the example of FIG. 9, it is 1024 cycles.

Figure 10:
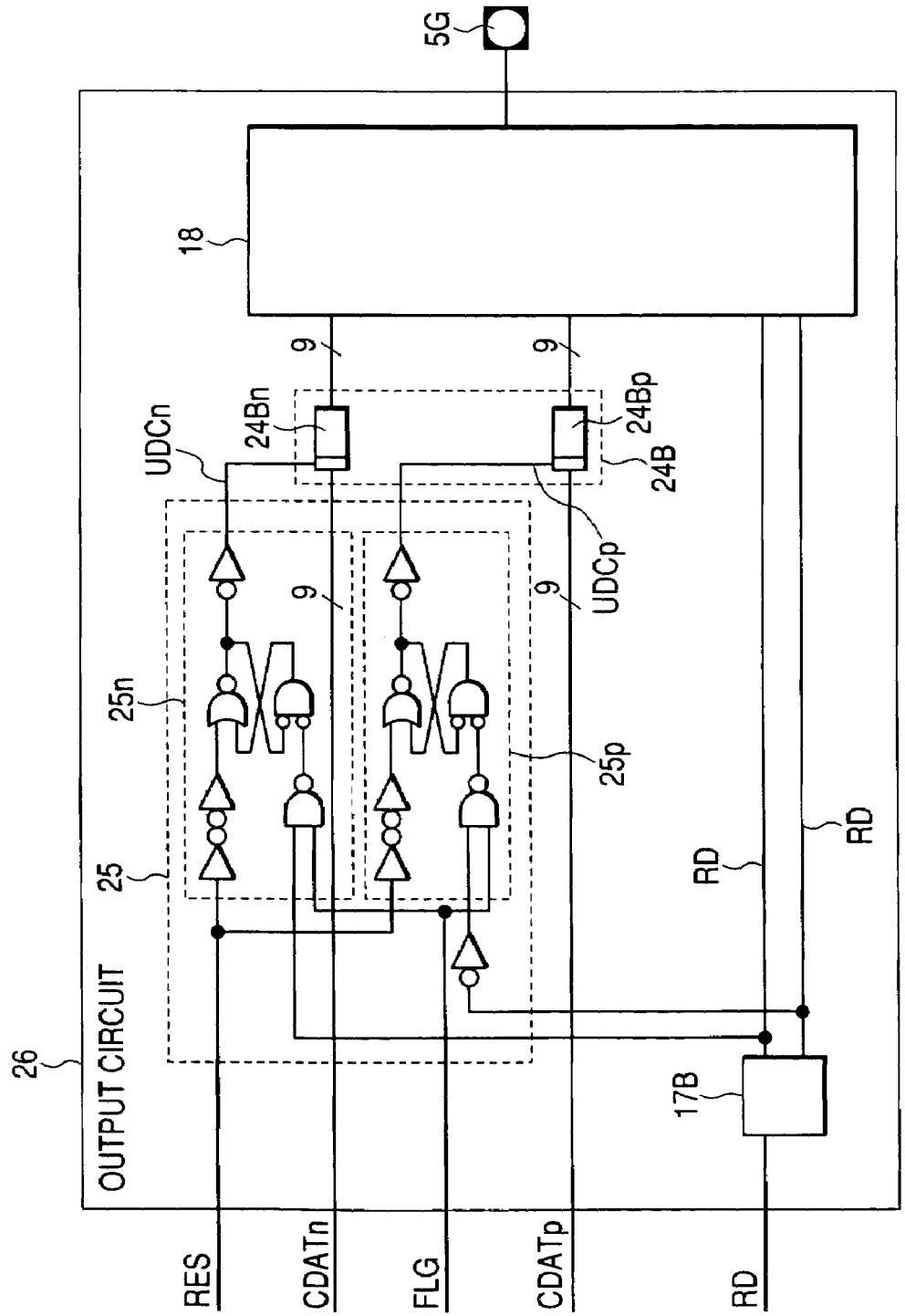
FIG. 10 is a logic circuit diagram showing the details of an output circuit.

FIG. 10 shows the details of the output circuit 26. The data feedback circuit 25 includes two RS (Reset/Set) flip-flops 25p and 25n. Inversion data of the read data RD are inputted to the set terminal of the RS flip-flop 25p and placed in a set state (update clock UDCp=1) when the read data RD are a low level, the impedance control data CDATp for PMOS are latched in a data latch 24Bp, and when the output buffer 18 is to conduct low level output, the impedance control data for the PMOS transistors placed in the OFF state are updatable. Also, the read data RD are inputted to the set terminal of the RS flip-flop 25n and placed in a set state (update clock UDCn=1) when the read data RD are a high level, the impedance control data CDATn for NMOS are latched in a data latch 24Bn, and when the output buffer 18 is to conduct high level output, the impedance control data for the NMOS transistors placed in the OFF state are updatable. A reset signal RES is applied to the reset terminals from the control circuit 43. The reset signal RES is a signal synchronous with a high level signal of a 32 division clock K32. A flag signal FLG is a control signal for enabling impedance control with a high level.

The impedance control circuit 35 uses the output transistors in the OFF state in the push-pull circuit as mutual conductance control targets, whereby the impedance updating does not affect the output operation even if the impedance of the output buffer is updated during the output operation.

Figure 11:
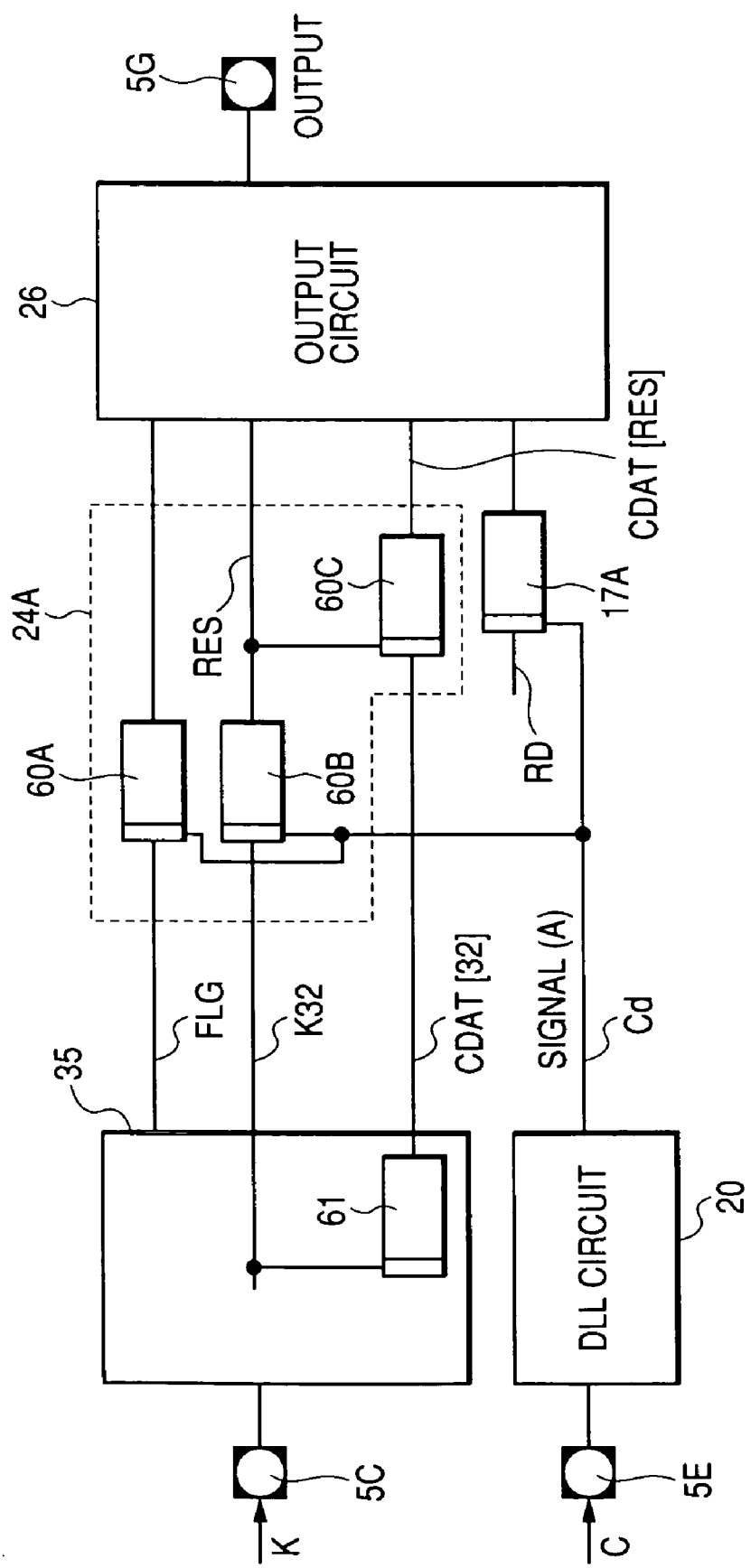
FIG. 11 is a block diagram showing a logic configuration that defines updating timing of the impedance control data.

FIG. 11 shows an example of a circuit that defines the update timing of the impedance control data. In the impedance control circuit 35, the impedance control data CDAT, the flag signal FLG and the reset signal RES are generated in synchronization with the internal operation clock K. The flag signal FLG and the reset signal RES generated by the impedance control circuit 35 are latched in latch circuits 60A and 60B in synchronization with a clock Cd (clock delayed plural cycles by the DLL circuit 20) for the data output operation. The impedance control data CDAT are latched by a latch circuit 61 in synchronization with the 32 division clock K32 where the clock K is divided into 32. The impedance control data CDAT (32) outputted from the latch circuit 61 are latched in a latch circuit 60C in synchronization with the reset signal RES of the clock Cd synchronization outputted from the latch circuit 60B being changed to a low level. The CDAT (RES) are the impedance control data outputted from the latch circuit 60C.

Figure 12:
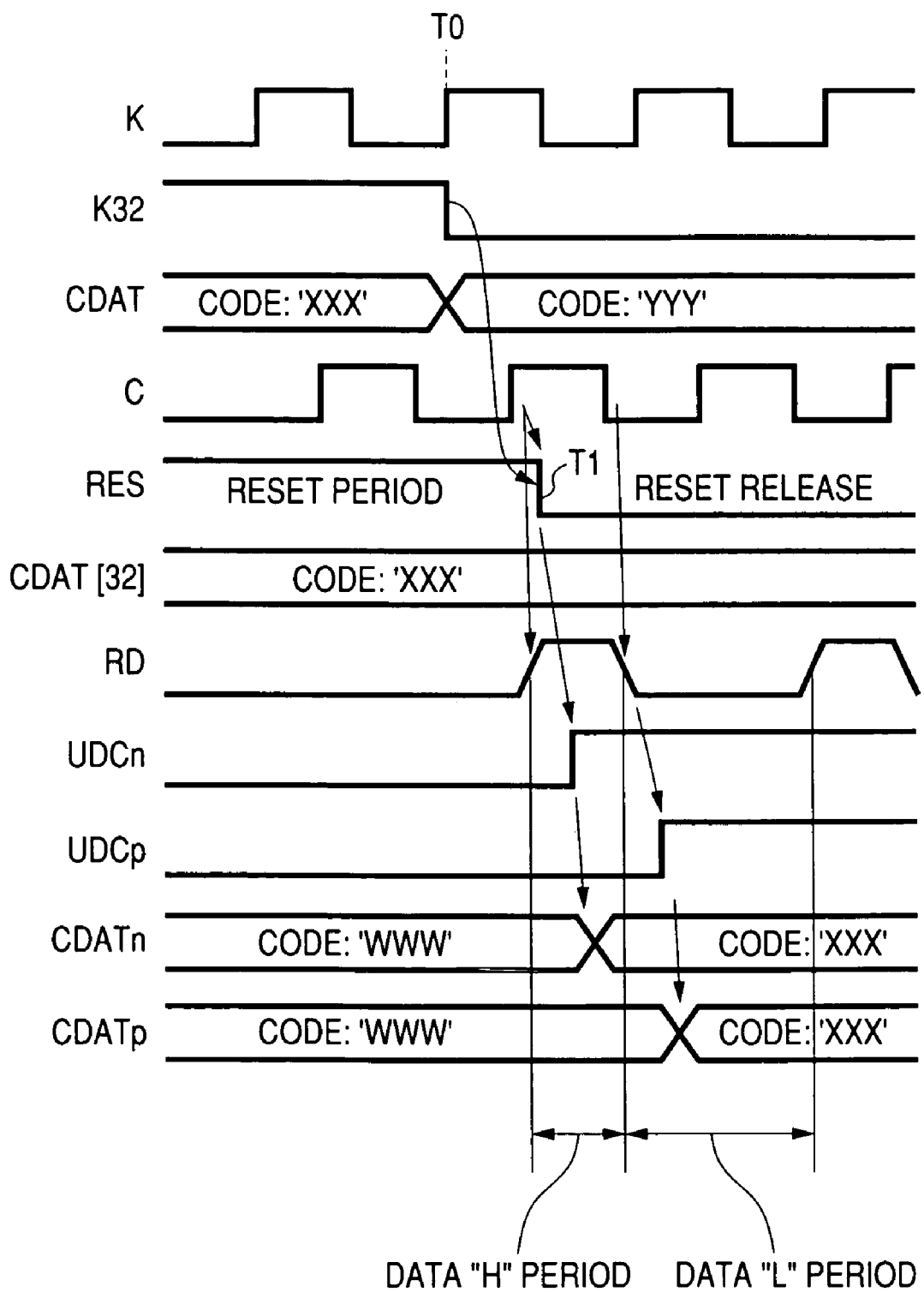
FIG. 12 is a timing chart showing update timing of the output circuit by latched impedance control data.

FIG. 12 shows the update timing of the output circuit by the latched impedance control data. The impedance control circuit 35 conducts the comparison operation for the impedance control data generation in synchronization with the cycles of the 32 division clock K32, so that the impedance control data CDAT of the latch circuit 61 are updatable per cycle. It will be assumed that, when the impedance control circuit 35 is conducting the generation of a code XXX as the impedance control data CDAT with the comparison operation in a certain cycle of the 32 division clock K32, the impedance control data CDAT are updated to a code YYY by a new comparison operation in the next cycle beginning at a time T0. When the cycle of the 32 division clock K32 changes at the time T0, the reset signal RES is changed immediately thereafter to a low level in synchronization with the clock C, and the reset states of the RS flip-flops 25p and 25n are released. The timing of this reset state release is the clock C synchronization, and the read data RD are also changed by the clock C synchronization. Thus, after the reset release, the update clocks UDCp and UDCn are changed from a low level to a high level in accordance with the logical value of the read data, and the impedance control data CDATp and CDATn of the latch circuits 24Bp and 24Bn are updated. The timing at which the updating of the impedance control data CDATp and CDATn becomes possible is in synchronization with the reset release timing (T1) of the clock C synchronization. Because this reset release timing (T1) is synchronous with the read data change timing of the clock C synchronization, the read data is not switched during updating of the impedance control data CDATp and CDATn. In this manner, because the update timing of the impedance control data with respect to the control target is synchronous with the clock C, when updating of the impedance control data is being conducted using the output transistors in the OFF state as targets, a situation does not arise where the output transistors in the OFF state is switched in the middle of the updating by the output inversion of the read data.

Figure 13:
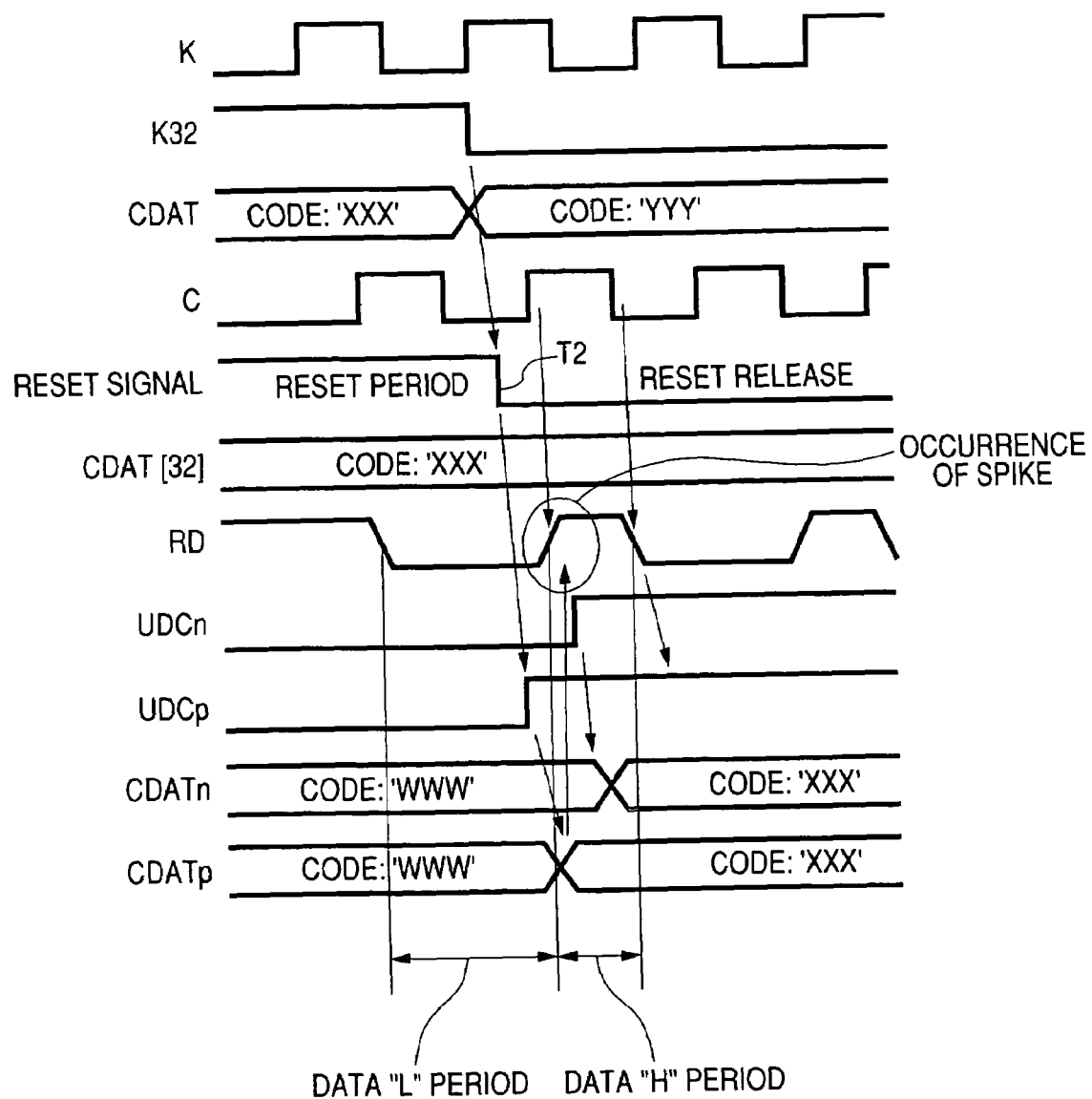
FIG. 13 is a timing chart showing the update timing of the output circuit by the impedance control data in the case of a comparative example where an RS flip-flop reset signal is synchronized with a cycle of a 32 division clock K32.

With respect thereto, in a case where, as shown in the comparative example of FIG. 13, the reset signal RES is synchronous with the 32 division clock K32, the timing at which updating of the impedance control data CDATp and CDATn becomes possible is synchronous with the reset release timing of the clock K synchronization and becomes asynchronous with the read data change timing of the clock C synchronization, so that there is the potential for the read data to be switched during the updating of the impedance control data CDATp and CDATn. In FIG. 12, the updating of the impedance control data CDATp is conducted at the switching point of the read data RD, and the ON resistance of the transistors during the output operation is changed, whereby there is the potential for the output of the read data to become temporarily unstable and undesirably generate a logical value inversion.

Figure 14:
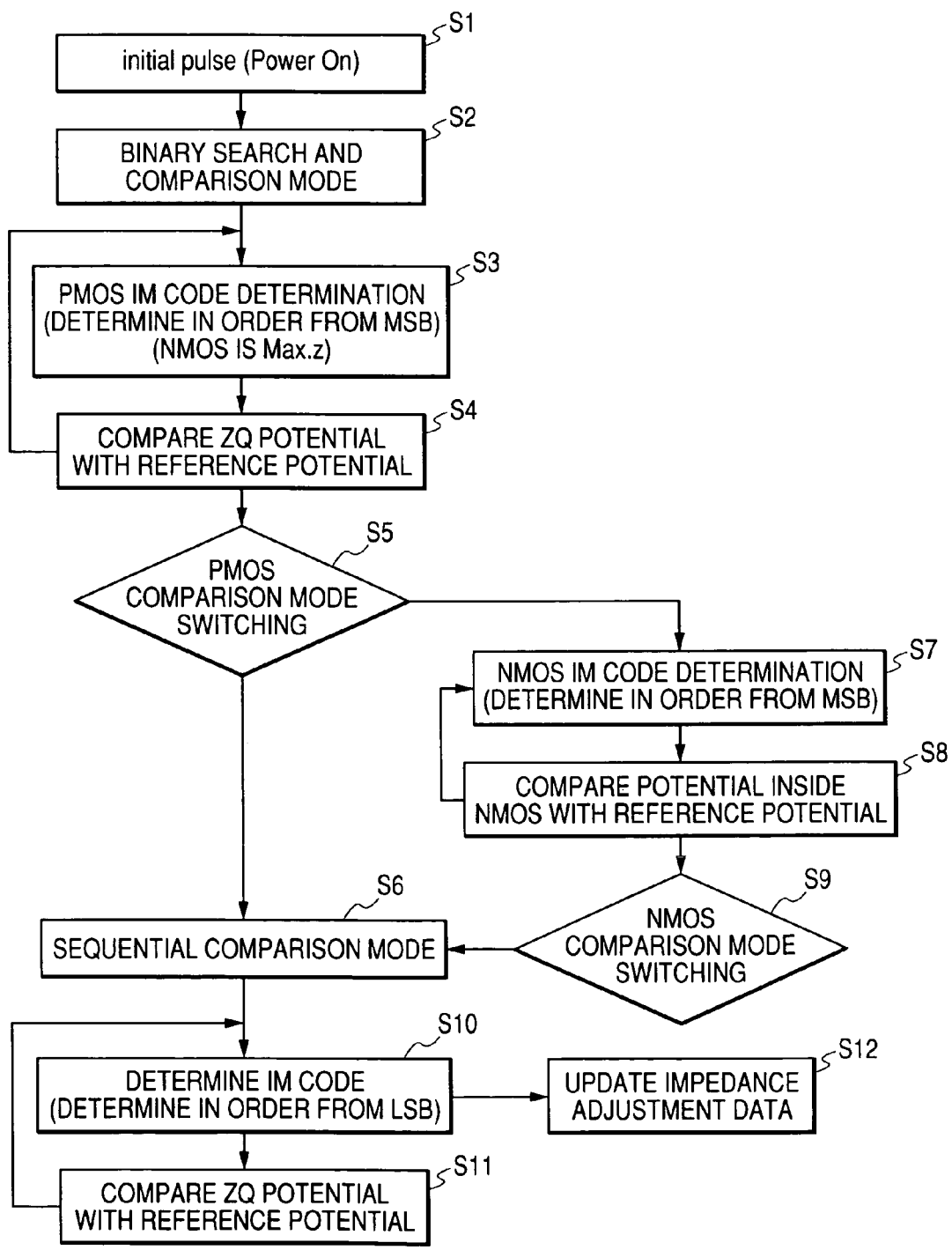
FIG. 14 is a flow chart showing the sequence of generating the impedance control data in the initial cycle of FIG. 9.

FIG. 14 shows the flow of the generation of the impedance control data in the initial cycle of FIG. 9. When the control circuit 43 detects that the power is ON (S1), it instructs the binary search and comparison mode (S2), and the binary search and comparison circuit 41 receiving this sets the values (impedance match codes=IM codes) of the target bits of the impedance control data (impedance codes) CDATp of the PMOS Q1 side of the output buffer 18 (S3). In this processing S3, the values are determined in order beginning with the MSB side of the impedance control data CDATp. In a case where the sizes of the PMOS Q1 are equal, the IM codes serving as one-time processing targets are plural bits excluding the LSB side. In this case, the maximum impedance is tentatively set with respect to the NMOS Q2 of the output buffer 18. The potential obtained at the voltage dividing node Nvd by the value (IM code) of the set target bit and the reference voltage (VDD/2) are compared by the voltage comparator 55, and the value (IM code) of the target bit is determined in accordance with the comparison result (S4). After the processing of S3 and S4 have been repeated to determine the values with respect to all bits of the impedance control data CDATp, the control circuit 43 conducts switching processing of the voltage comparison mode of the PMOS Q1 side of the output buffer 18 (S5), and switches the voltage comparison mode of the PMOS Q1 side of the output buffer 18 to the sequential comparison mode (S6).

The voltage comparison mode of the NMOS Q2 side of the output buffer 18 maintains the binary search and comparison mode. The binary search and comparison circuit 41 sets, with respect to the NMOS Q2 side of the output buffer 18, the values (IM codes) of the target bits of the impedance control data CDATn of the NMOS Q2 of the output buffer 18 (S7). In this processing S7, the values are determined in order beginning with the MSB side of the impedance control data CDATn. At this time, the previously determined impedance control data CDATp are applied with respect to the NMOS Q2 of the output buffer 18. The potential obtained at the voltage dividing node Nvdn by the value (IM code) of the set target bit and the reference voltage (VDD/2) are compared by the voltage comparator 58, and the value (IM code) of the target bit is determined in accordance with the comparison result (S8). The processing of S7 and S8 is repeated to determine the values with respect to all bits of the impedance control data CDATn. Thereafter, switching of the voltage comparison mode of the NMOS Q2 side of the output buffer 18 to the sequential comparison mode is instructed (S9), and the voltage comparison mode of the NMOS Q2 side of the output buffer 18 is also switched to the sequential comparison mode (S6).

At this stage, the impedance control data are already initially acquired. When the sequential comparison mode is instructed, the sequential comparison circuit 42 uses the LSB of the impedance control data already generated as IM code (S10), compares the voltage divided potential resulting from the set IM code and the reference voltage (VDD/2) with the voltage comparator 55, and determines the value of the target IM code in accordance with the comparison result (S11). The processing of S10 and S11 is conducted a necessary number of times until the voltage comparison operation converges at a match point. Thus, impedance control data that have been dynamically sequentially updated are obtained (S12). Thereafter, the SRAM 1 becomes readable/writable by the chip-enabling.

In the example of FIG. 9, the impedance control data are dynamically corrected in the sequential comparison mode in the initial cycle, and even immediately after the SRAM 1 has become chip-enable, the output of the read data can be conducted using the output buffer 18 whose impedance has been matched by the impedance control data conforming to the environment. In a case where a sudden environmental change is not at all expected during the reset period, there is not particular problem if correction by the sequential comparison mode is not conducted in the initial cycle resulting from the power being turned ON.

Figure 15:
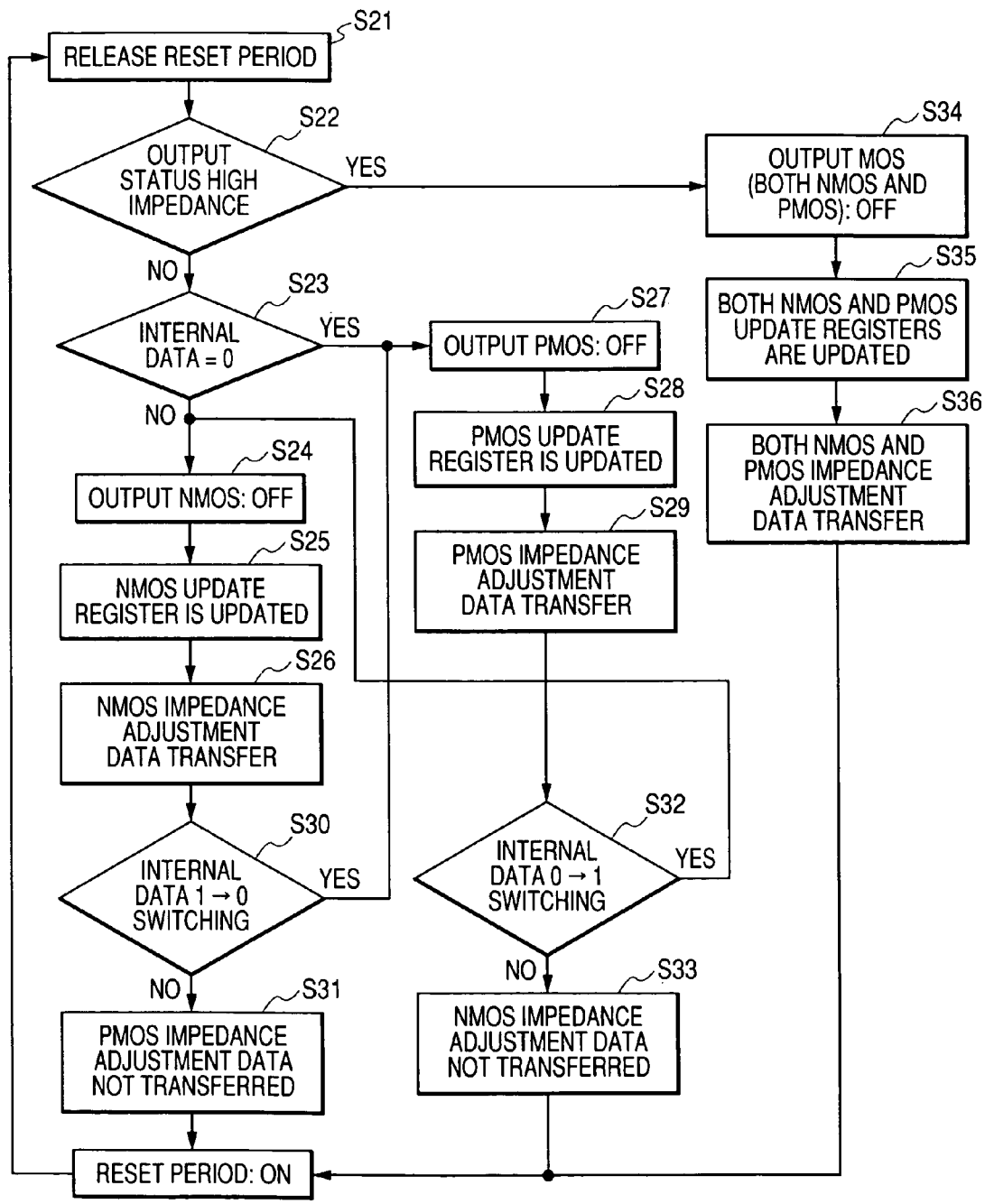
FIG. 15 is a flow chart showing the sequence of updating the impedance control data after power on reset release of the SRAM.

FIG. 15 shows the flow of update processing of the impedance control data after the power ON reset release of the SRAM 1. When the control circuit 43 detects the release period of the reset of the reset signal RES synchronous with the 32 division clock K32 (S21), it determines whether or not the output state of the output buffer 18 is a high impedance state (output disable state) (S22).

When the output state is not a high impedance state, the control circuit 43 determines whether or not the read data (internal data) are the logical value "0" (S23). When the read data are not "0", the register 24Bn conducts the latch operation (S25) when the NMOS Q2 of the output buffer 18 are in the OFF state (S24), and the impedance control data CDATn transmitted to the NMOS Q2 are updated (S26). In step S23, when the read data are "0", the register 24Bp conducts the latch operation (S28) when the PMOS Q1 of the output buffer 18 are in the OFF state (S27), and the impedance control data CDATp transmitted to the PMOS Q1 are updated (S29).

After step S26, when the logical value of the data is switched from "1" to "0" by the read data switching determination (S30), the flow proceeds to step S27, and when there is no switching by step S30, the transmission of the impedance control data CDATp of the PMOS Q1 side to the register 24Bp is not conducted.

After step S29, when the logical value of the data is switched from "0" to "1" by the read data switching determination (S32), the flow proceeds to step S24, and when there is no switching by step S32, the transmission of the impedance control data CDATn of the NMOS Q2 side to the register 24Bn is not conducted. In the determination operations of steps S30 and S32, the determination result is forced to "NO" in the data switching from the second time on, and it is ensured that the impedance control data are not repeatedly updated in the reset release period. Excessive power consumption can be reduced, which also contributes to the reduction of noise.

When the output state is determined to be high impedance in the determination of step S22, because both the PMOS Q1 and the NMOS Q2 of the output buffer 18 are in the OFF state (S34), both the registers 24 Bp and 24Bn conduct the latch operations (S35), and both the impedance control data CDATp transmitted to the PMOS Q1 and the impedance control data CDATn transmitted to the NMOS Q2 are updated (S36).

After the reset period is ON, the arrival of the reset release period is again waited on, and the same processing as described above is repeated. The update processing of the impedance control data is conducted every time per reset release period resulting from the reset signal RES.

Figure 16:
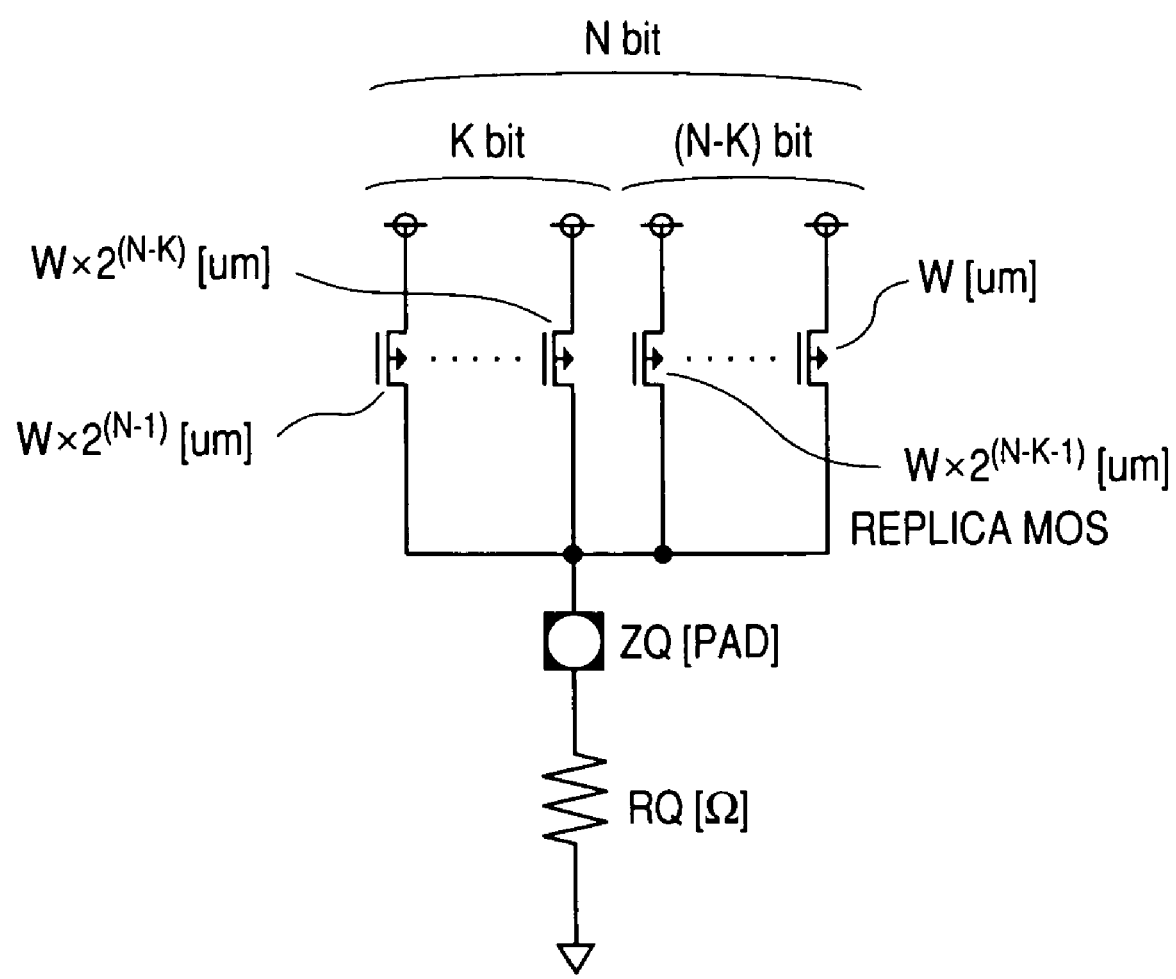
FIG. 16 is a circuit diagram showing another example of a replica PMOS circuit.

FIG. 16 shows another example of the replica PMOS circuit. As shown in the drawing, the transistor size (gate width) of the PMOS Q1d may be weighted by the power of 2. The replica NMOS Q2d may also be similarly weighted. Of course, similar weighting is also administered to the PMOS Q1 and the NMOS Q2 configuring the output portion of the output buffer.

Figure 17:
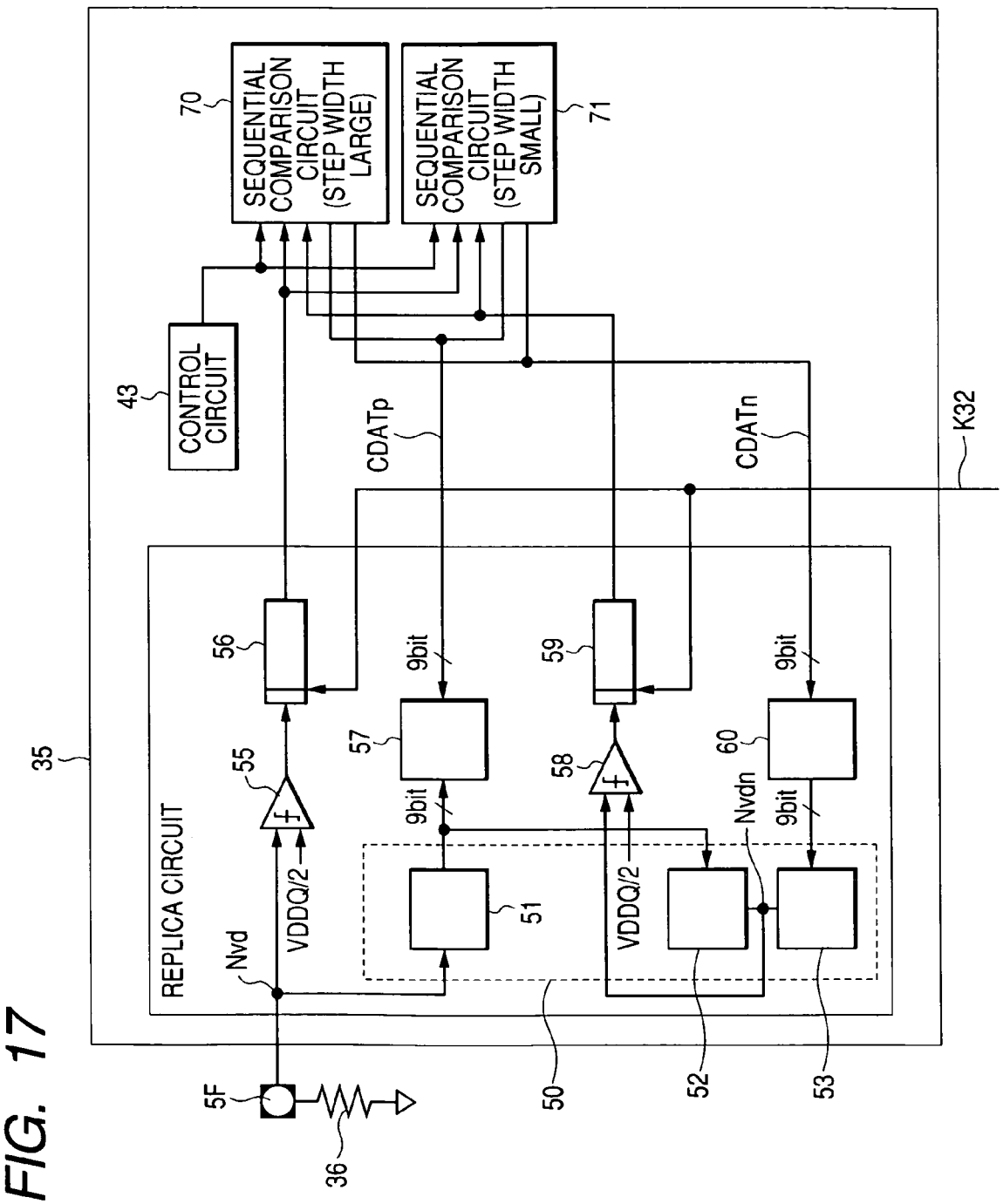
FIG. 17 is a block diagram showing an impedance control circuit configured so that update and initial impedance control operation are conducted by a sequential comparison operation.
Figure 18:
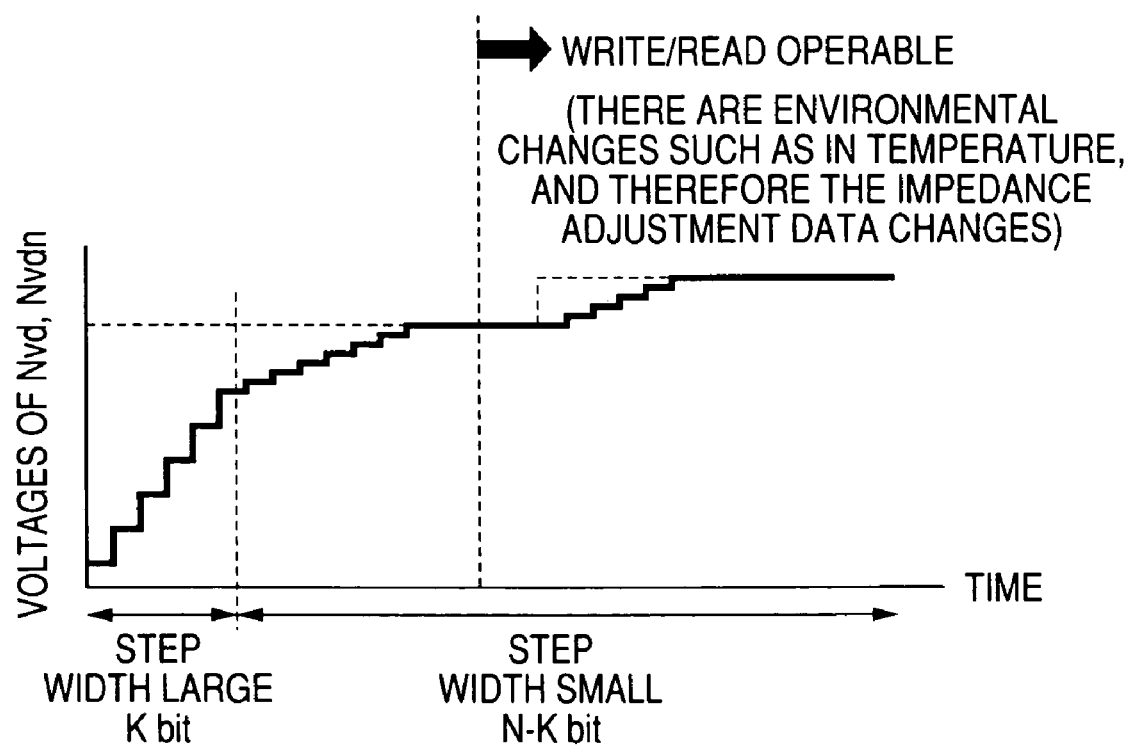
FIG. 18 is a timing chart showing a control operation of the impedance control data by the impedance control circuit of FIG. 17.

FIG. 17 shows an example of the impedance control circuit 35 configured to conduct the initial impedance control operation and the sequential comparison operation together with updating. The point of difference with FIG. 5 is the use of a sequential comparison circuit 70 where the impedance control step (step width) has been made large and a sequential comparison circuit 71 where the impedance control step has been made small, with the former being used in the first half of the initial impedance control operation and the latter being used in the last half of the initial generation of the impedance control data and the updating. Because the remaining configuration is the same as FIG. 5, detailed description thereof will be omitted. FIG. 18 shows the control operation timing waveform of the impedance control data resulting from the impedance control circuit 35 of FIG. 17.

Figure 19:
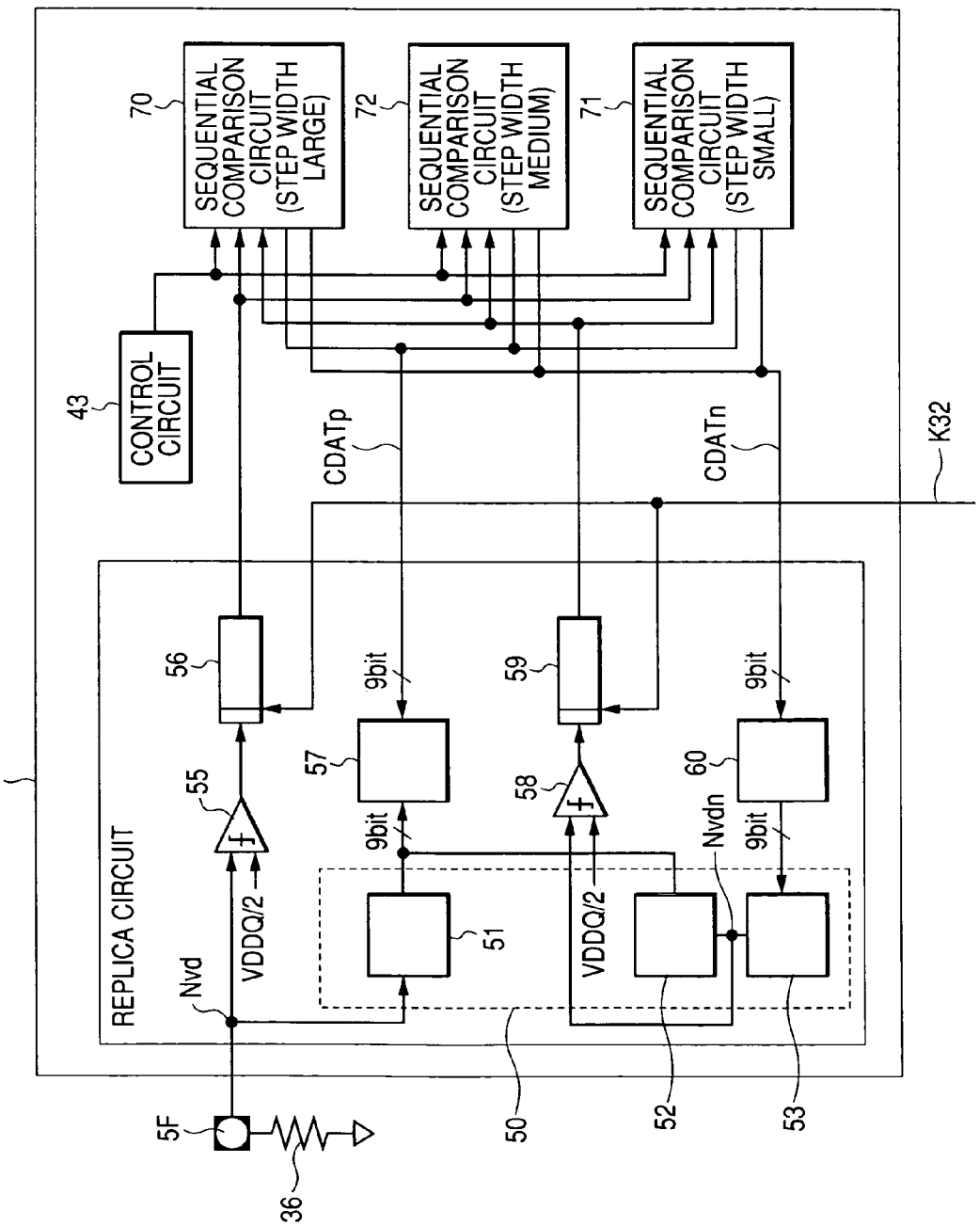
FIG. 19 is a block diagram showing another example of the impedance control circuit configured so that update and initial impedance control operation are conducted by an sequential comparison operation.
Figure 20:
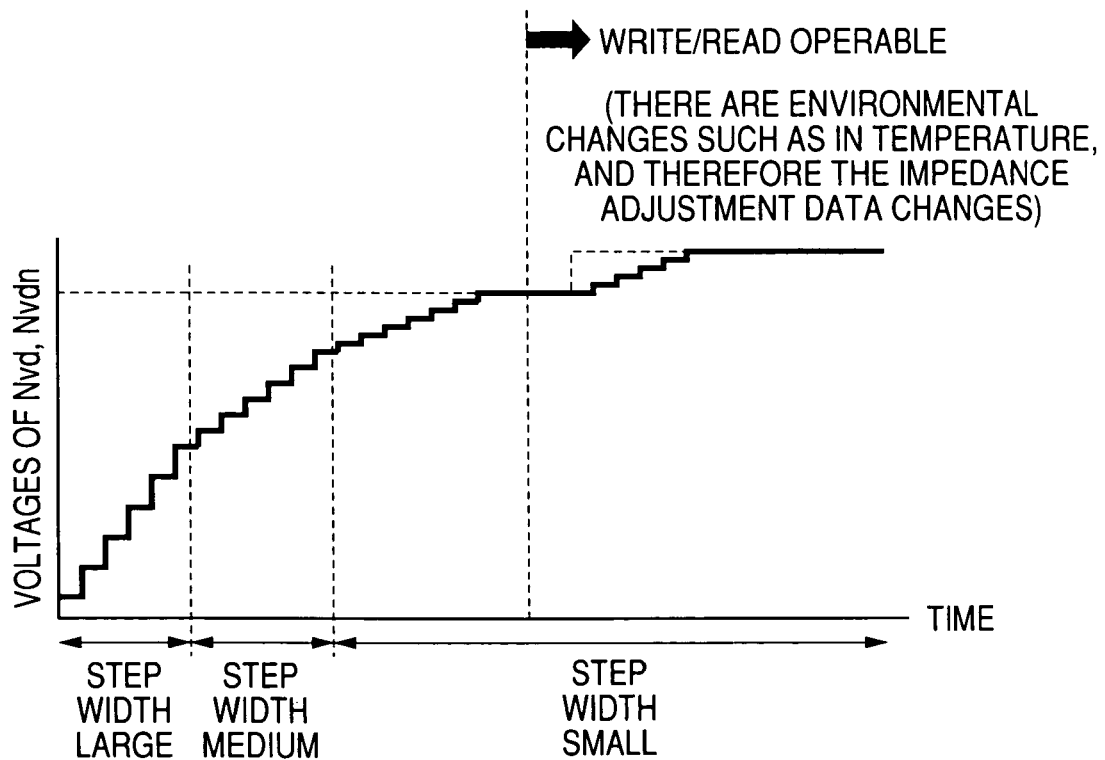
FIG. 20 is a timing chart showing a control operation of the impedance control data by the impedance control circuit of FIG. 19.

FIG. 19 shows another example of the impedance control circuit 35 configured to conduct the initial impedance control operation and the sequential comparison operation together with updating. The point of difference with FIG. 17 is the use, in addition to the sequential comparison circuit 70 where the impedance control step (step width) has been made large and the sequential comparison circuit 71 where the impedance control step has been made small, of a sequential comparison circuit 72 where the impedance control step has been made intermediate, and the step width is sequentially switched and used in order from the large one. Because the remaining configuration is the same as that of FIG. 17, detailed description thereof will be omitted. FIG. 20 shows the control operation timing waveform of the impedance control data resulting from the impedance control circuit 35 of FIG. 19.

Figure 21:
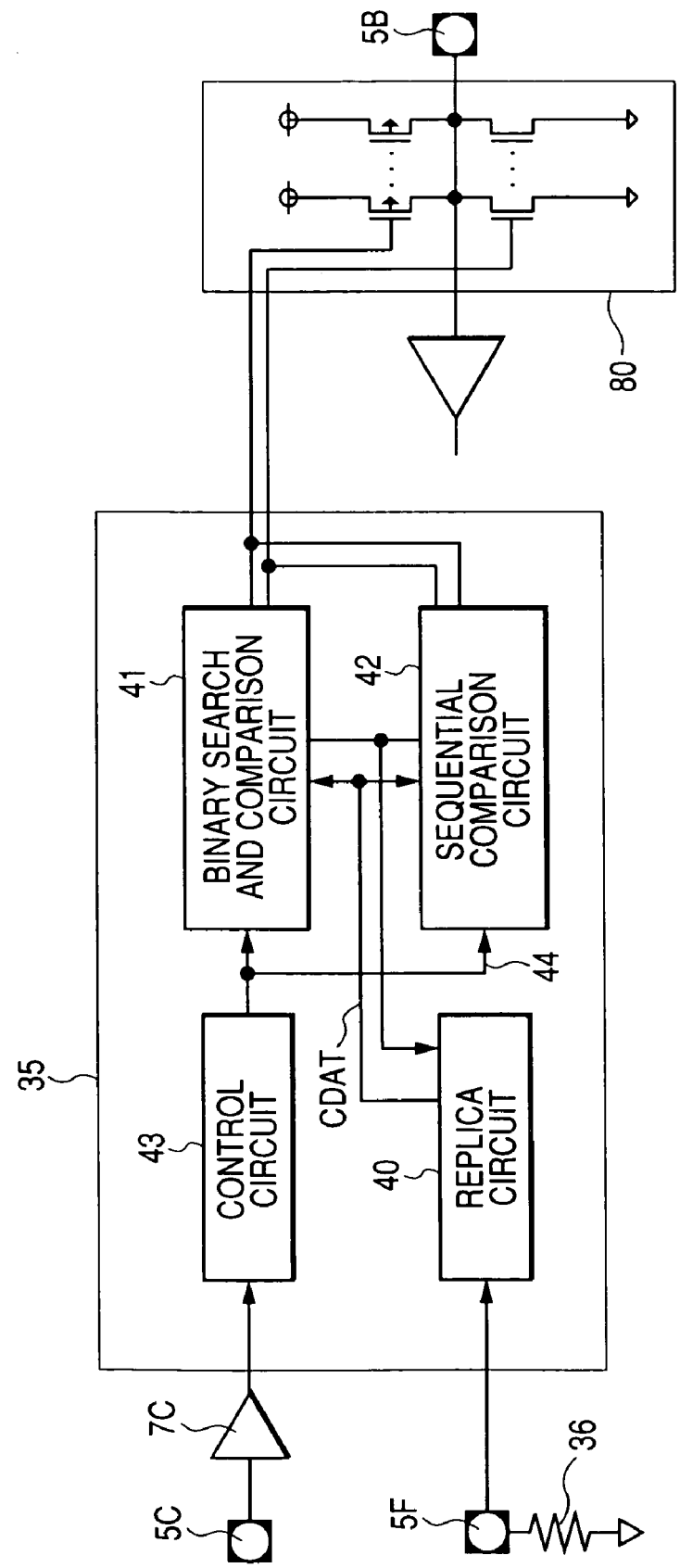
FIG. 21 is a block diagram showing an example where the impedance control circuit is applied to an input buffer.

FIG. 21 shows an example where the impedance control circuit 35 is applied to an input buffer 80. In this case, the replica circuit 40 is configured to simulate an input transistor of the input buffer 80.

Figure 22:
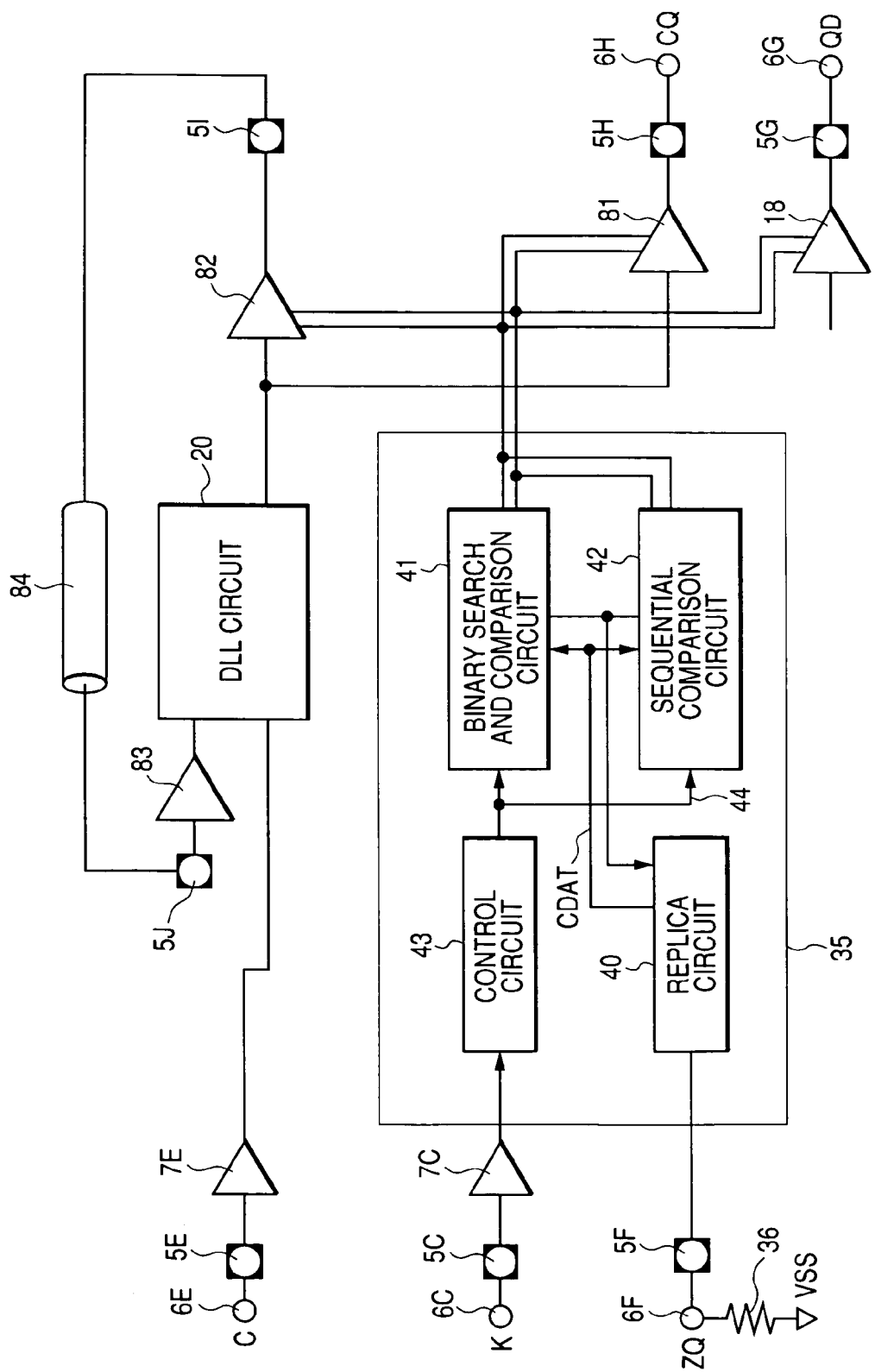
FIG. 22 is a block diagram showing an example where the impedance control circuit is applied to a data output buffer, a clock output buffer and an output buffer of a DLL circuit.

FIG. 22 shows an example where the impedance control circuit 35 is applied to a data output buffer 18, a clock output buffer 81 and a DLL circuit output buffer 82. Although they are not illustrated, the DLL circuit 20 includes a variable delay circuit and a phase comparison circuit. The variable delay circuit delays an input clock C in accordance with a comparison result resulting from the phase comparison circuit. The phase comparison circuit compares the phase of the input clock C with the phase of a clock fed back from a feedback loop where the input clock C is variably delayed, and controls the delay amount of the variable delay circuit and the delay amount of the feedback loop so that both are matched. The feedback loop realizes a delay amount that simulates the delay amount inside the SRAM chip of the transmission path of the clock C and the delay amount inside the package from the pad electrodes of the chip to the external connection terminals. At this time, the package delay amount from the external connection terminal 6E of the package 3 to the pad electrode 5E of the chip and the package delay amount from the pad electrode 5H of the chip to the external connection terminal 6H of the package are realized by a replica wiring 84 inside the package simulating the actual delay amount of the wiring inside the package. The replica wiring 84 inside the package is connected to the pad electrode 5J from the pad electrode 5I of the SRAM chip and served as a part of the feedback loop. The output buffer 82 connected to the replica package 84 inside the package configuring part of the feedback loop simulates the output buffer 81, and the input buffer 83 simulates the clock input buffer 7E. 82 and 83 serve as replica buffers for the replica wiring inside the package. When impedance control is conducted with respect to the clock output buffer 81, the output buffer 82 simulating this also similarly serves as the target of the impedance control.

Figure 23:
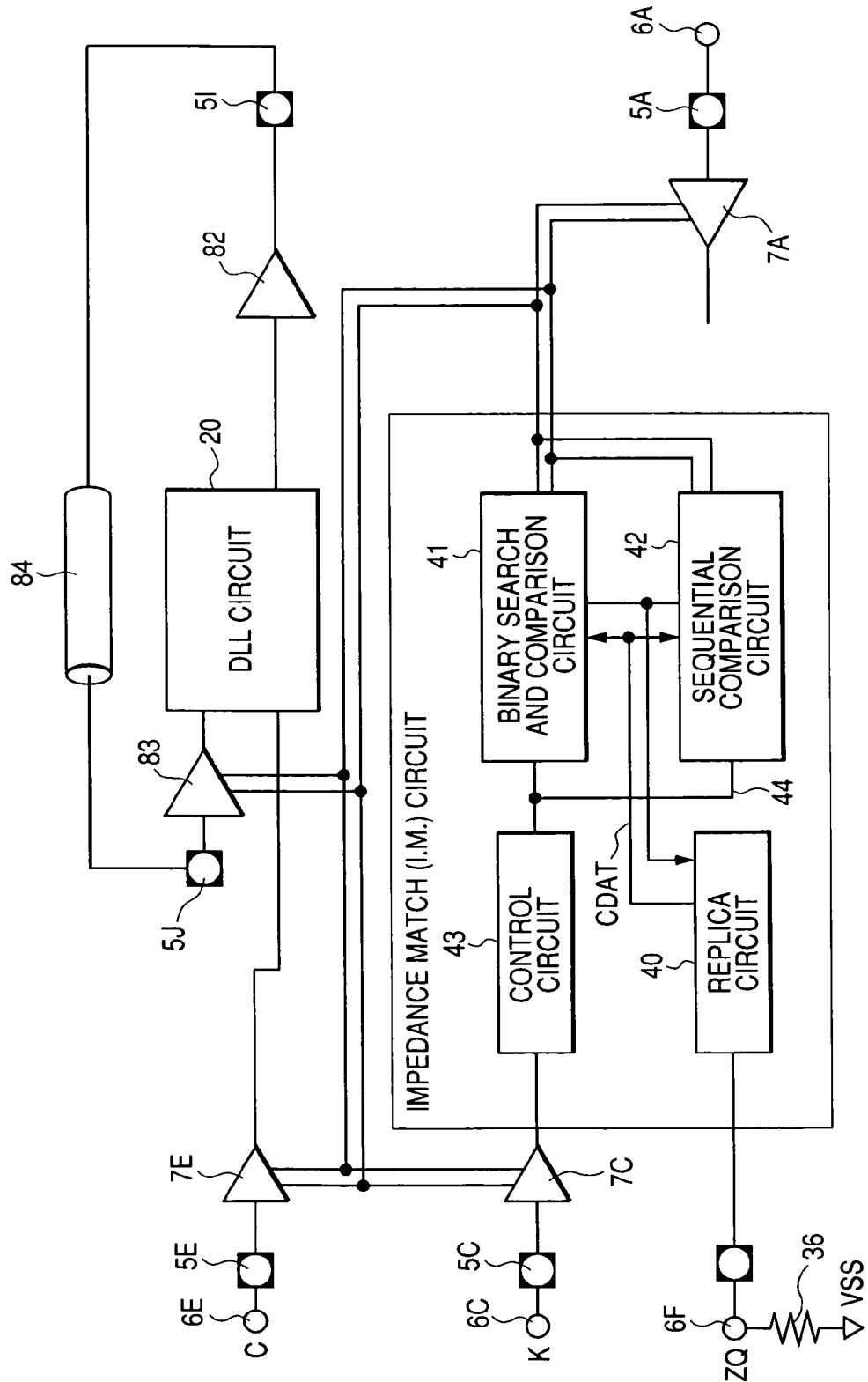
FIG. 23 is a block diagram showing an example where the impedance control circuit is applied to an address input buffer, a clock input buffer and an input buffer of a DLL circuit.

FIG. 23 shows an example where the impedance control circuit 35 is applied to an address input buffer 7A, clock input buffers 7E and 7C, and the DLL input buffer 83. As was described on the basis of FIG. 22, because the input buffer 83 simulates the clock input buffer 7E, the input buffer 83 also similarly serves as the target of the impedance control when the clock input buffer 7E serves as the input impedance control target.

According to the SRAM 1 described above, the initialization cycle becomes faster by combining the binary search and comparison method and the sequential comparison method, and noise at the time of the read/write operation can be suppressed. For example, in the case of the sequential comparison method, the initialization cycle becomes a 16384 cycle ($=2^9 \times 32$) when the 32 division clock is used. When the binary search and comparison method is used, the initialization cycle is shortened to 288 ($=9 \times 32$). Also, glitch noise does not affect the output because the invention is configured so that the impedance control circuit corresponds to the 2 phase clocks C and K. Thus, the SRAM 1, where the initialization cycle of the impedance control circuit is short and the output reflectance noise is small, can be realized. Also, a SRAM where there is little performance deterioration resulting from power supply noise stemming from the operation of the impedance control circuit can be realized.

The invention devised by the present inventor has been specifically described above on the basis of embodiments, but the invention is not limited thereto. It goes without saying that the invention is variously alterable within a range that does not deviate from the gist thereof.

For example, the invention can widely applied not only to a SRAM but also to a Flash memory and various types of memory format LSI, all-purpose microcomputers, data processing LSI such as customized communication LSI, and various types of semiconductor devices.

What is claimed is:

1. A semiconductor device including:
    interface buffers whose internal impedances are controlled by impedance control data; and
    an impedance control circuit that generates the impedance control data,
    wherein the impedance control circuit includes
        a first impedance control mode that generates the impedance control data by a sequential comparison operation resulting from predetermined impedance control steps and sets the impedance control data in the interface buffer, and
        a second impedance control mode that updates the impedance control data set in the interface buffer by a sequential comparison operation resulting from the predetermined impedance control steps,
    wherein the impedance control steps of the first impedance control mode and the impedance control steps of the second impedance control mode are different,
    wherein the impedance control steps of the first impedance control mode are different steps of plural stages, and
    wherein relatively larger steps of the different steps of plural stages are used in the former sequential comparison operation and relatively smaller steps are used in the latter sequential comparison operation.

* * * * *